(12) United States Patent
Sorrento

(10) Patent No.: US 11,398,082 B2
(45) Date of Patent: Jul. 26, 2022

(54) AFFINE TRANSFORMATIONS OF 3D ELEMENTS IN A VIRTUAL ENVIRONMENT USING A 6DOF INPUT DEVICE

(71) Applicant: Mindesk S.r.l., Bari (IT)

(72) Inventor: Gabriele Sorrento, Bari (IT)

(73) Assignee: Mindesk S.r.l., Bari (IT)

( * ) Notice: Subject to any disclaimer, the term of this patent is extended or adjusted under 35 U.S.C. 154(b) by 109 days.

(21) Appl. No.: 16/480,742

(22) PCT Filed: Jan. 25, 2018

(86) PCT No.: PCT/IB2018/050437
§ 371 (c)(1),
(2) Date: Jul. 25, 2019

(87) PCT Pub. No.: WO2018/138657
PCT Pub. Date: Aug. 2, 2018

(65) Prior Publication Data
US 2021/0134069 A1  May 6, 2021

(30) Foreign Application Priority Data
Jan. 26, 2017  (IT) .................. 102017000008727

(51) Int. Cl.
*G06F 3/0481* (2022.01)
*G06T 19/20* (2011.01)
*G06F 3/0346* (2013.01)

(52) U.S. Cl.
CPC ............ *G06T 19/20* (2013.01); *G06F 3/0346* (2013.01); *G06F 3/0481* (2013.01); *G06T 2200/24* (2013.01); *G06T 2219/2016* (2013.01)

(58) Field of Classification Search
CPC ................. G06T 19/20; G06T 2200/24; G06T 2219/2016; G06F 3/0481; G06F 3/0346
See application file for complete search history.

(56) References Cited

U.S. PATENT DOCUMENTS

| | | | | |
|---|---|---|---|---|
| 5,771,042 A | * | 6/1998 | Santos-Gomez | G06F 3/0481 715/792 |
| 5,838,832 A | * | 11/1998 | Barnsley | G06T 9/001 382/249 |
| 6,306,091 B1 | * | 10/2001 | Sumanaweera | G01S 7/52023 128/916 |
| 6,426,745 B1 | * | 7/2002 | Isaacs | G06F 3/04845 345/419 |

(Continued)

*Primary Examiner* — Phenuel S Salomon
(74) *Attorney, Agent, or Firm* — James Creighton Wray

(57) ABSTRACT

The present patent application relates to three-dimensional computer graphics applications for performing an affine transformation of an element in a virtual environment using an input devices. According to the present invention, the method comprises receiving a first data set from the input device, wherein the first data set comprise at least one input data, which comprise the coordinates of at least one point in the physical space and a switch status, selecting at least an affine transformation based on the first data set, receiving a second data set from the input device, wherein the second data set comprises at least one input data, which comprise the coordinates of at least one point in the physical space and a switch status and executing the affine transformation on the element, the transformation being based on the second data provided by the input device.

11 Claims, 20 Drawing Sheets

(56) References Cited

U.S. PATENT DOCUMENTS

| | | | | |
|---|---|---|---|---|
| 6,629,065 | B1* | 9/2003 | Gadh | G06F 30/17 |
| | | | | 703/1 |
| 10,284,794 | B1* | 5/2019 | Francois | G06K 9/46 |
| 2005/0271300 | A1* | 12/2005 | Pina | G06K 9/522 |
| | | | | 382/294 |
| 2012/0275722 | A1* | 11/2012 | Yang | G06K 9/6211 |
| | | | | 382/294 |
| 2013/0227493 | A1* | 8/2013 | Schmidt | G06F 3/04845 |
| | | | | 715/849 |
| 2014/0267254 | A1* | 9/2014 | Sievert | G06T 17/05 |
| | | | | 345/420 |
| 2014/0363096 | A1* | 12/2014 | Zhou | G06T 7/33 |
| | | | | 382/284 |
| 2018/0101986 | A1* | 4/2018 | Burns | G06F 3/0346 |
| 2018/0140942 | A1* | 5/2018 | Miller | G06F 3/011 |
| 2019/0087020 | A1* | 3/2019 | Robinson | G06F 3/0488 |
| 2020/0045249 | A1* | 2/2020 | Francois | H04N 5/3415 |

\* cited by examiner

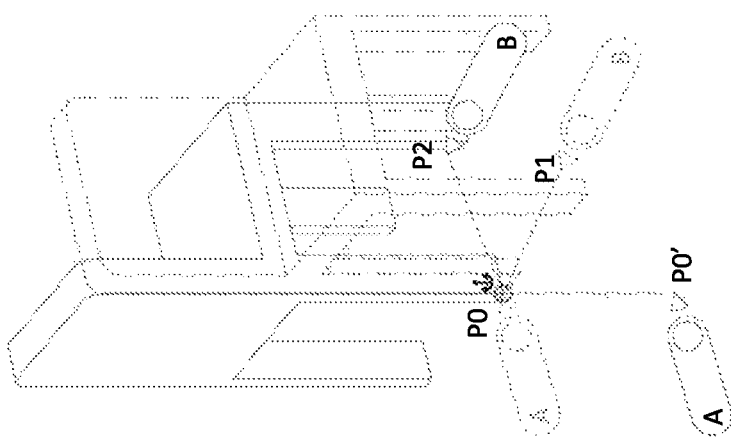
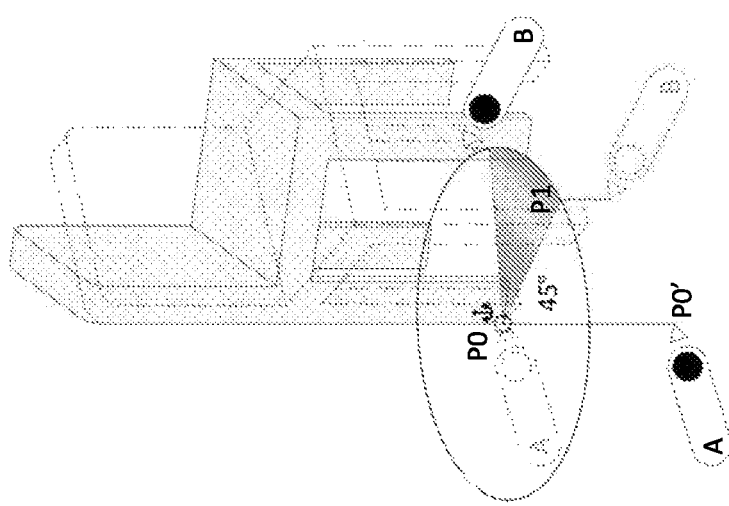
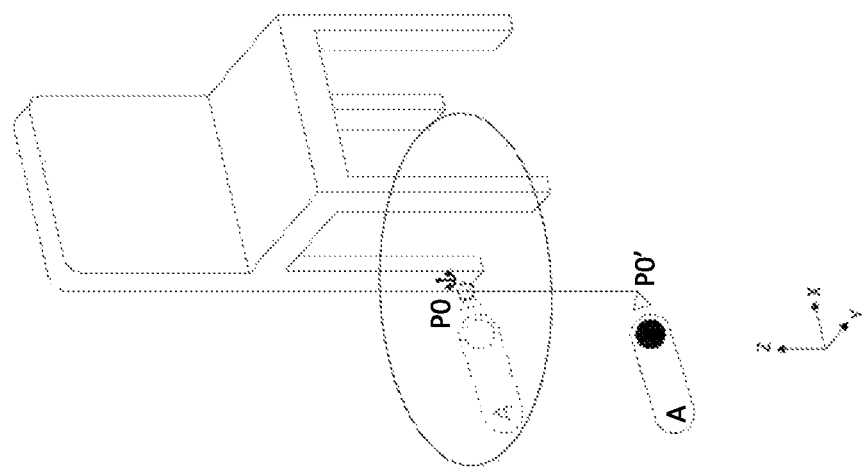
FIG. 9

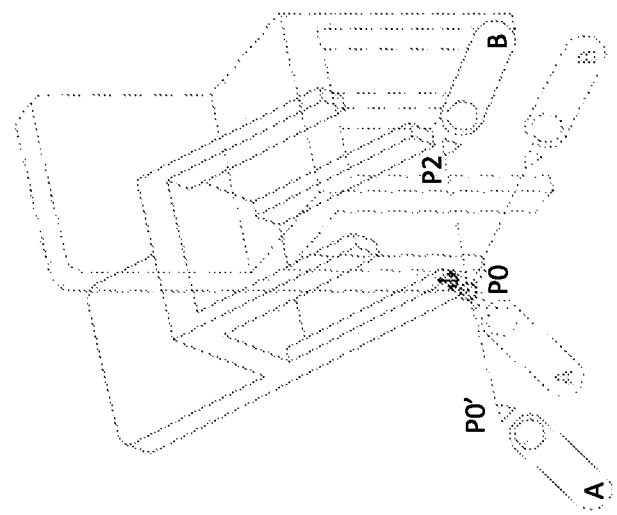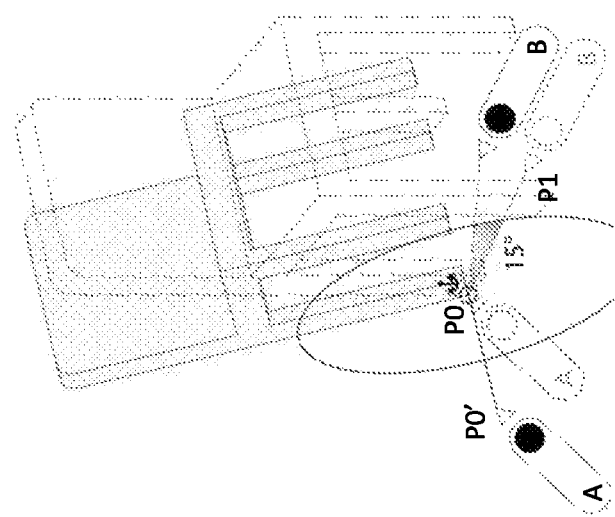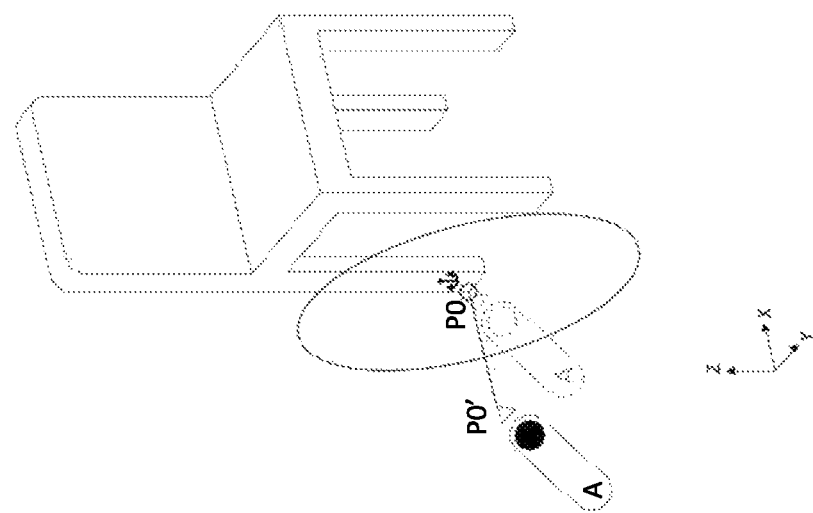
FIG. 10

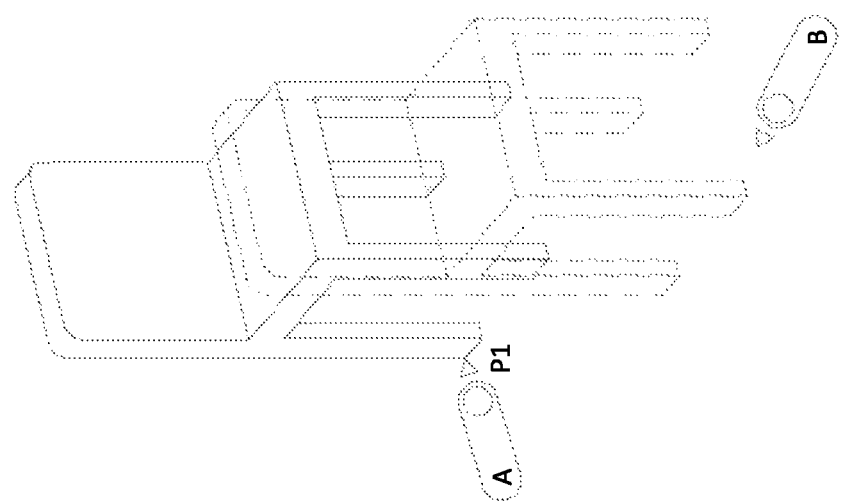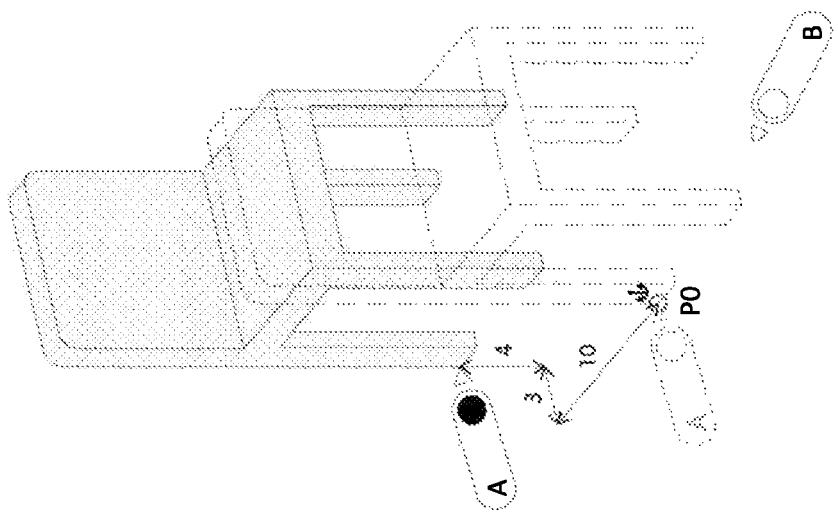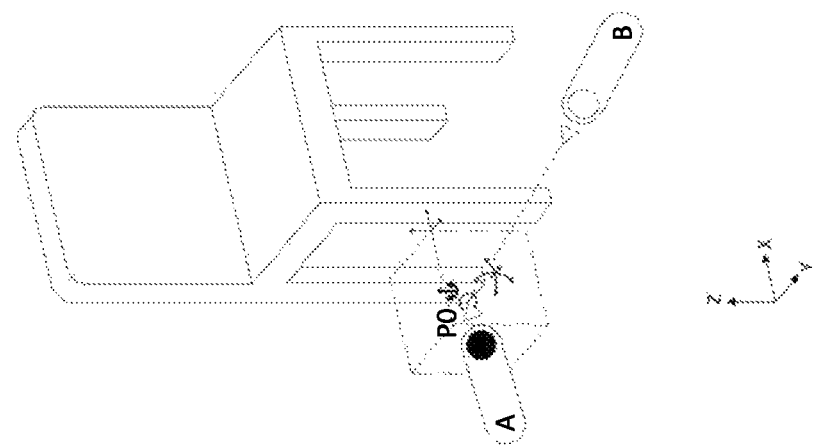
FIG. 14

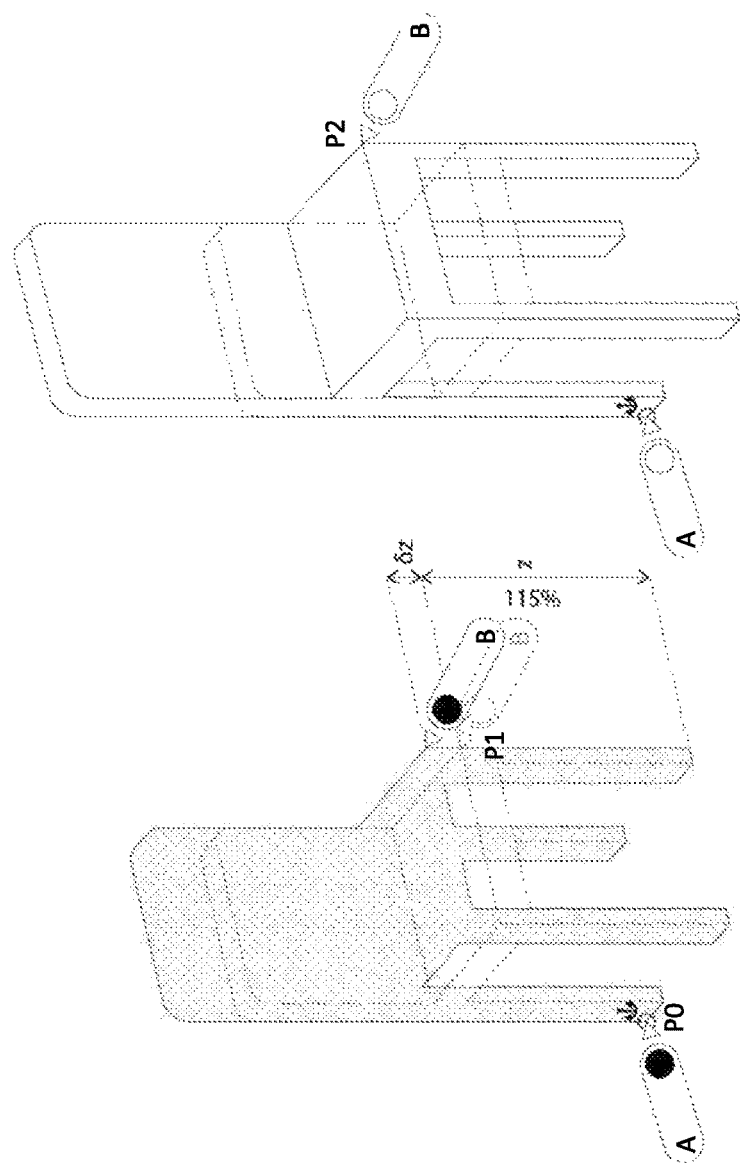
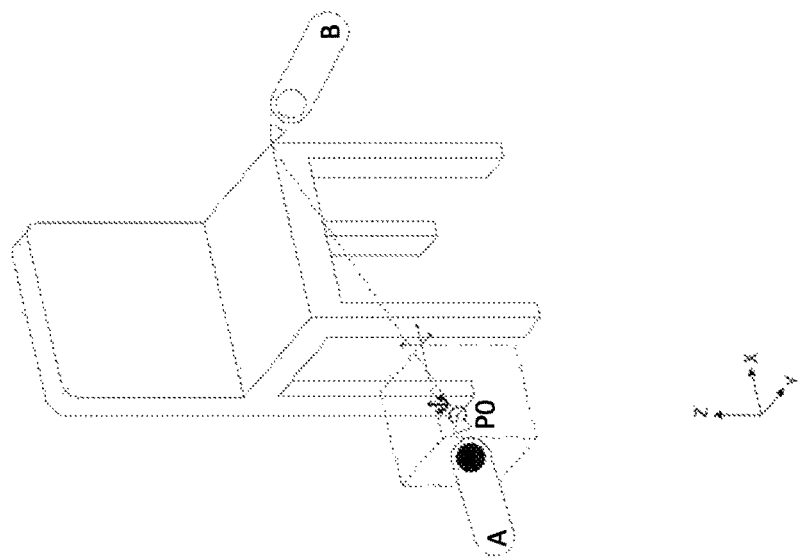
FIG. 16

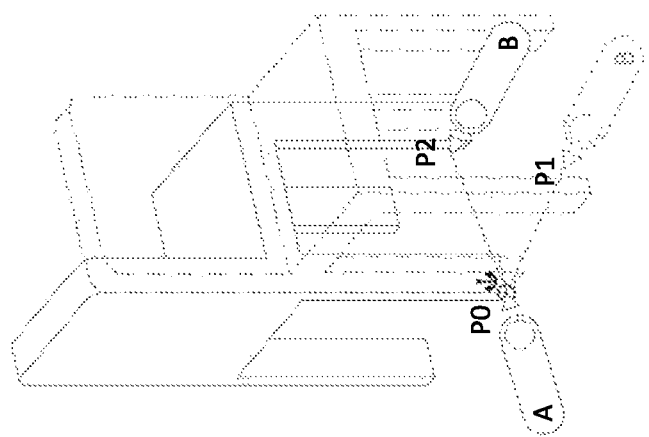
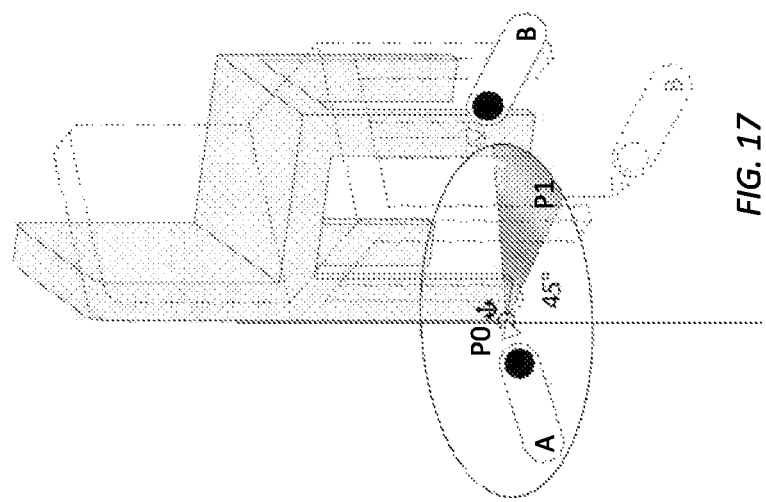
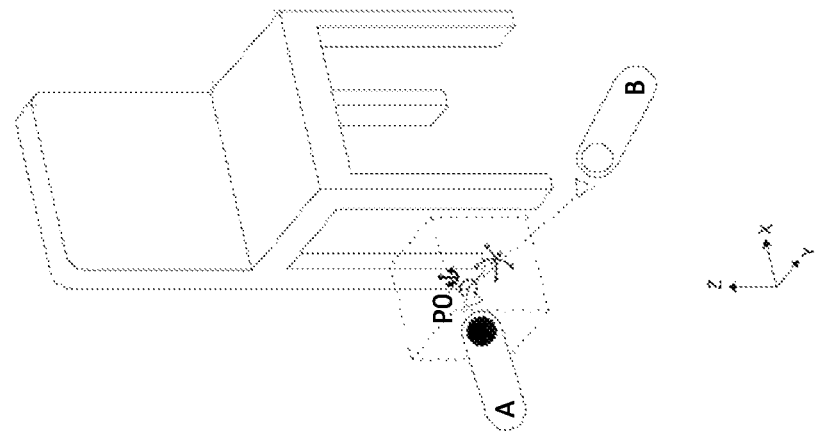
FIG. 17

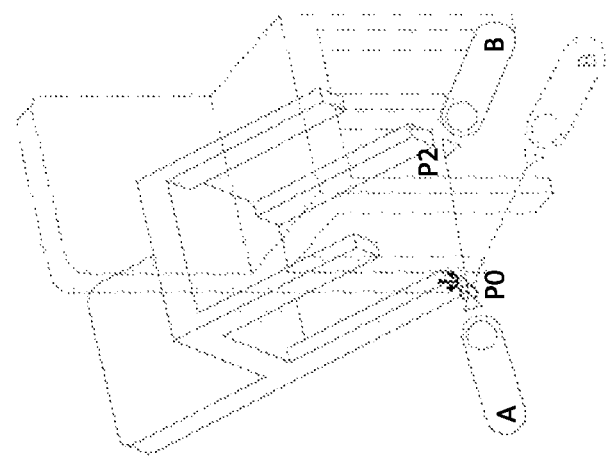
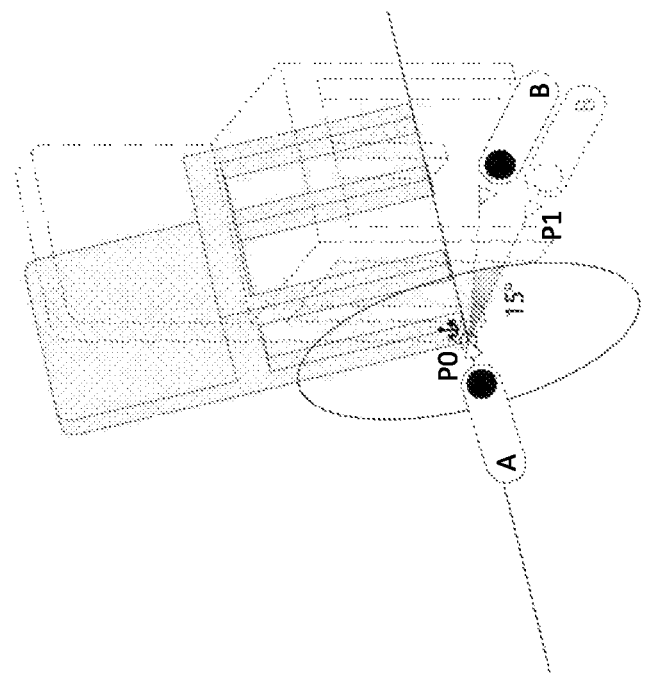
FIG. 18
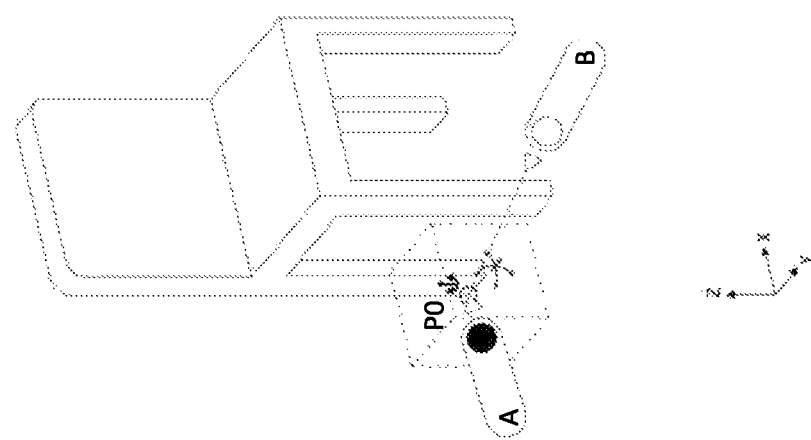

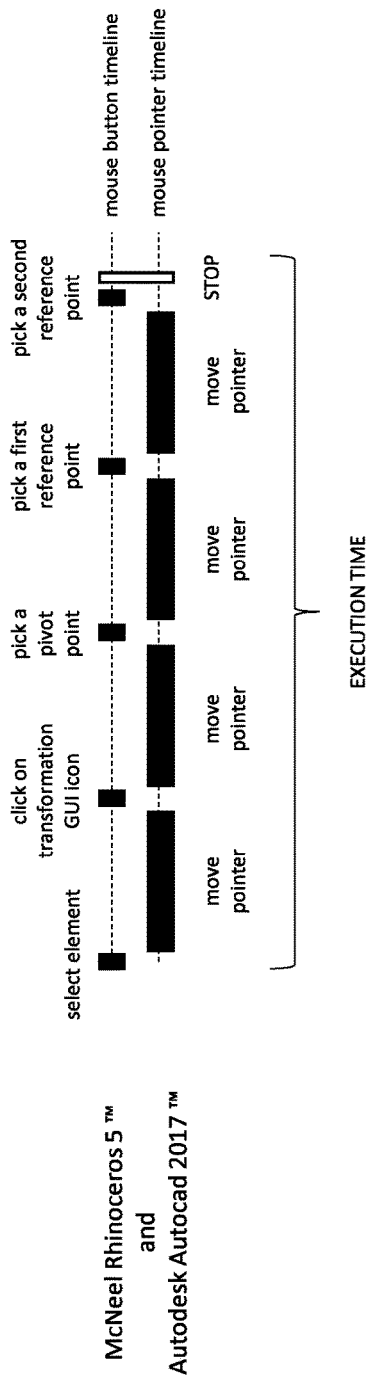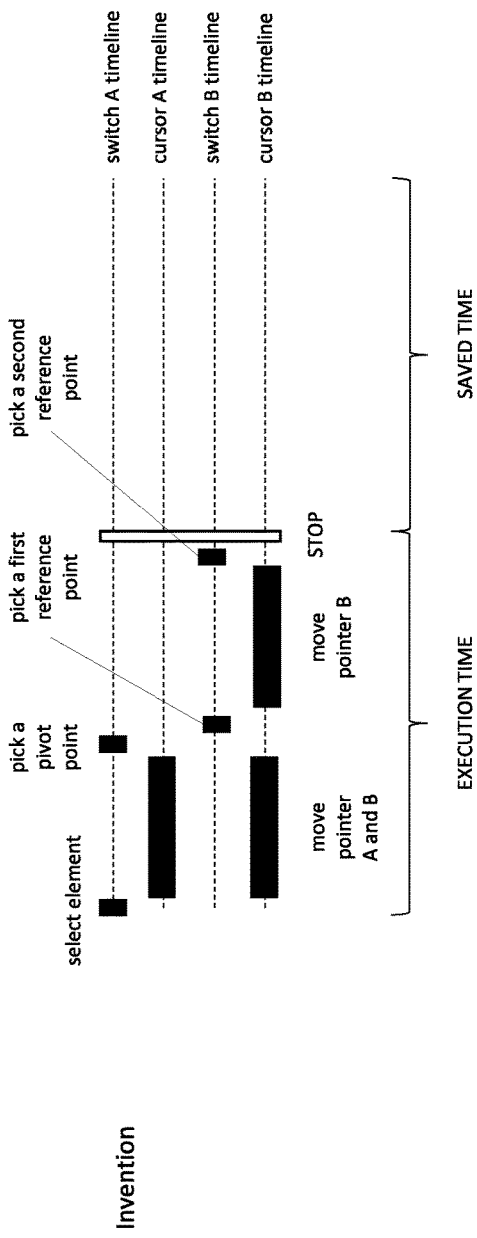
FIG. 19
FIG. 19 a  2D rotation by prior art scheme
FIG. 19 b  2D rotation by invention scheme

AFFINE TRANSFORMATIONS OF 3D ELEMENTS IN A VIRTUAL ENVIRONMENT USING A 6DOF INPUT DEVICE

This application claims the benefit of Italian Application No. 102017000008727 filed Jan. 26, 2017 and PCT/IB2018/050437 filed Jan. 25, 2018, International Publication No. WO 2018/138657 A1, which are hereby incorporated by reference in their entirety as if fully set forth herein.

FIELD OF THE INVENTION

The present patent application relates to three-dimensional (3D) graphics applications, and in particular, to a method, an apparatus and a program computer product for performing affine transformations of 3D elements of a virtual environment using a couple of input devices.

BACKGROUND

When working with three-dimensional data (i.e., in a graphics application), a number of affine transformations of the data are needed to design, build or edit 3D models.

In geometry, an "affine transformation" is a function between "affine spaces", in which the points, straight lines and planes are preserved. Therefore, after an affine transformation, a set of parallel lines remain parallel. Some examples of affine transformations include translation, scaling, reflection, rotation, and compositions of them in any combination and sequence.

The above mentioned kind of transformations, provided in all current 3D graphics applications (i.e., CAD systems), allow the user to translate, reflect, rotate or scale elements into the virtual environment and are essential in the design process.

Each affine transformation in the 3D space may vary from a particular combination of geometric parameters, each causing a different result.

In geometry, a possible variation of the rotate transformation concerns the rotation axis (or pivot axis, or pivot point). For instance, the user may rotate a 3D element around an axis passing by its geometric center or around an eccentric axis. The former transformation produces a pure rotation of the element, the latter produces a rotation and a displacement of the element.

Another possible variation of the rotate transformation concerns the orientation of the rotation axis. For instance, in a scene where the global coordinate system is oriented in a way such that the global axis Z corresponds with the direction "up", a 180° rotation of a 3D model representing a car whose four wheels are touching a plane parallel to the global XY plane representing the ground returns a 3D model of the same care whose wheels still touch said ground plane. Instead, a 180° rotation of the car 3D model around the X or Y axis returns the same car model upside down, whose four wheels do not touch the ground plane.

In another scene representing the solar system, the global coordinate system is oriented in a way such that the global XY plane corresponds to the planets' orbit plane around the sun. In this scene, a rotation of an element representing the earth around a generically tilted axis passing by two points representing earth's north pole and south pole, returns a 3D model of the same earth in another hour of the day.

Another possible variation of the rotate transformation concerns two reference points: a rotation start point and a rotation end point. Usually, the entity of the rotate transformation depends on a rotational angle parameter. Some applications require the user to input the rotation angle manually via command line, other applications allow the user to define said angle by a rotation start point and a rotation end point, where the rotation angle is measured between the start point, the pivot point and the end point. For instance, in a scene where the global coordinate system is oriented in a way such that the global axis Z corresponds with the direction "up", a 3D model representing a ship which prow is facing the north direction corresponding to the Y axis, and which hull sits on a plane parallel to the global XY plane representing the sea plane, is rotated. Said rotation axis is parallel to the global Z axis and passing by the 3D model center, the start reference point correspond to the tip of the prow and the end reference point lies on the positive X axis. Said rotation returns a 3D model of said ship whose prow is now facing East. In other words, the 3D model is rotated 90° clockwise. As a skilled in the art would understand, this method combined with a proper position of the pivot axis, is very useful to align elements of a 3D scene.

In geometry, a possible variation of the scale transformation concerns the anchor point. For instance, the user may scale a 3D element with respect to an anchor point coinciding with its geometric center. This scale transformation would expand or contract the 3D element by the same extent in all directions.

In another variation, said anchor point coincides with an extreme of the 3D element. As result of such scale transformation, all the parts of the 3D element would depart or approach the anchor point, while the extreme coinciding with the anchor point would stay unchanged.

Another possible variation of the scale transformation concerns the definition of a start and an end reference points and the definition of multiple scale factors. Usually, the entity of the scale transformation depends on at least one scale factor. Some applications require the user to input the scale factor manually via command line, other applications allow the user to define said scale factor through a start point and an end point, where the scale factor is equal to the distance (or the projected distance) between the anchor point and the end point, divided by the distance (or the projected distance) between the anchor point and the start point. The distance may be a direct or projected on one or more fundamental planes. As a skilled in the art would understand, the entity of the scale may depends on more than one scale factor. For instance, a non-uniform scale in the 3D space requires three scale factor, one per each component in X, Y, and Z direction of the transformation.

In general, any scale operation can be mathematically represented as a particular case of a general 3D scale. 1D and 2D scale transformations, for instance, are particular cases where respectively two or one scale factor are equal to one. Uniform scale transformations are particular cases where two or more scale factors are mutually equal. In non-uniform transformations at least two scale factors are mutually different.

For instance, a 1D scale of a sphere where the scale factor is greater than one, returns a football-ball-like geometry. Also, a uniform 2D scale of a 3D model of a vertical cylindrical column where the scale factor in Z direction is equal to one and the other two factor are equally greater than one, returns a circular column having the same height and a larger diameter. Eventually, a uniform 3D scale of a sphere returns a sphere.

Another applicative example of the scale transformation involving the definition of an anchor point, a start and an end reference points, may concern a 3D scene comprising an array of 3D models representing a number of vertical cylindrical columns laying on a flat surface representing the virtual ground plane, where one of the columns is shorter than the others. A user may need to make all columns the same height and, thus, perform a 1D scale on the shorter column, where the anchor point is the center of the lower base, the start reference point is the center of the higher base, and the end reference point has the same elevation of the top base of the other columns.

Current typical 3D authoring tools, allows users to perform affine transformations and some of the above mentioned variations on two-dimensional displays using two-dimensional user interfaces. Prior art interfaces for 3D modeling are based on command line input, point-and-click input, and a graphic UI interactive gizmos.

Prior art de facto standard interface for editing a 3D model with affine transformations comprises the following steps: selecting an element in the 3D scene, selecting the desired transformation through a icon on the UI, inputting the anchor point, inputting a couple of points to define a rotation axis, another couple of reference points by clicking with the mouse on the screen, and hitting a key on the keyboard to finish the procedure. Each step of this procedure requires the user to interact with the mouse button to execute each step, move the mouse to the next point or UI interaction area, interact with the button again and so on until the process is complete. This time expensive procedure is similar in many commercial software, included McNeel Rhinoceros 5™ and Autodesk Autocad 2017™ and requires unnecessary steps, as in FIG. 19a. In particular, selecting the desired transformation by interacting with an UI element is a step that prolongs the whole operation and may be avoided by adopting a novel scheme, as in FIG. 19b.

Furthermore, some prior art interfaces allows to work on different virtual 2D planes (XY, YZ, XZ) with 2D input devices like mouse, touch-pad, stylus. 2D input devices limits the possibility to input certain 3D points, in fact, it is not possible to input a 3D point in a single interaction while working on said 2D planes. Some graphics software provides the possibility to input 3D points using 2D input devices by representing the 3D scene by an axonometric or perspective projection on a 2D graphic output device, however, all 3D points inputted in such way are destined to lay on a virtual plane. In other words, points that do not belong to that virtual plane cannot be inputted with this method before switching to another virtual plane. Other graphic software provides the possibility to input points in multiple windows representing the scene from different orthographic point of views (for instance, the XY plane and YZ plane), however, this method requires at least two interactions to define each single point, which is too long and inefficient. Moreover, having the screen spitted in multiple views limits the work area.

Thus, a faster and more direct input interface that reduces input steps and allows direct 3D point input is required.

Advancement in computer hardware and display media technologies have fostered a number of 3D input-output devices (e.g. virtual reality head mounted displays, 6 DOF controllers, 6 DOF styluses, hand tracking devices) that enabled a full and immersive 3D interaction.

A three-degree of freedom device (3 DOF) is a device that provides spatial positional coordinate info to a computer. A six degree of freedom (6 DOF) input device is a device that provides spatial positional and orientation coordinates to the computer. This kind of device provides a richer set of data compared to bi-dimensional devices like mouse, trackpads and 2D styluses. If supported with a proper software interface, this kind of input devices can enable more productive workflows in graphics software. Unfortunately, prior interfaces fail in taking full advantage of 3D input devices.

Some experimental immersive interfaces have leveraged tri-dimensional input devices and virtual reality head mounted display to enhance 3D modeling. For instance, IMG. 20 shows a GUI gizmo in Unity VR Editor™. The gizmo appears when an element of the 3D scene is selected and allows to perform some transformations by grabbing one of the GUI handlers around the element. For instance, some handlers are configured to trigger a scale transformation of the element, other handlers to rotate it. As a skilled in the art would understand, a limit of prior immersive interfaces consist in all the transformations happening with respect of the geometric center of a virtual bounding box of an element. Therefore, the user can not choose a different pivot point. Furthermore, rotations are limited to the fundamental X, Y, and Z axis without the possibility to set a generic axis. Another limit of prior immersive interfaces is that scale transformations adopt the same scale factor in all direction and the virtual bounding box center as anchor point. Thus, non-uniform scale are not allowed. Sometime, 3D authors need scale a 3D element while keeping a part of said element fixed in the space (i.e. the base of a column), however, this possibility is not available in prior immersive interfaces. Prior immersive interfaces focus the interaction on the element selected and do not provide the ability to control transformations through reference points. This limit impacts the workflow of those author who work on complex scenes comprising a multitude of 3D elements. In fact, those skilled in the art know it is common practice to use other elements of the scene as a reference (i.e. aligning elements to a wall, combining parts of an assembly, etc.) while 3D editing. Thus, a more flexible and complete immersive interface that comprises the use of reference points is required.

Another limit of gizmo GUIs in immersive prior interfaces consist in requiring a precise user input while interacting with the handlers. Often 3D authors go through a hectic workflow comprising hundreds of transformation iterations within the same session. In this context, failures in interactions with the UI are a major cause of frustration. Thus, a more direct and reliable immersive interface is required.

Prior 2D-implemented interfaces, 3D interfaces and immersive interfaces limit the possibility of 3D authors. As previously explained, most of limitations are due to their reliance on 2-D input devices (i.e. mouse, keyboards etc.) that are unsuitable for 3-D modeling tasks. 2D-implemented virtual 3D interaction methods inhibit users' ability to create, manipulate, and modify virtual shapes in a straightforward manner. The use of 2D control mechanisms for interacting with 3D design models have historically constrained designers to work with serialized transformation operations that are complex and non-intuitive. Since such interactions require users to map 2D inputs into 3D shape modeling operations through GUI widgets, they are cognitively tedious to use and distract users' attention away from the design task. They also stifle creativity and exploratory design by not supporting spontaneity in the modeling process.

The method here presented addresses prior art interfaces limitations and provides a simple and straightforward scheme to perform at least 23 different affine transformations. The method presented includes a mechanism that automatically determines the kind of transformation desired by the user without requiring the user to select, indicate, or click on specific GUI icons, as in FIG. 19b. Also, the method presented achieves enabling a 3D anchor point control for scale transformation, 3D pivot point and 3D axis for rotations. It further enables using reference points to transform elements with respect to other elements in a complex 3D scene. The user can perform the method by mean of a 3D input device. The device can be either single-handed (i.e. a 6 DOF stylus) or two-handed (including, but not limited to: HTC Vive™ controllers, Oculus Touch™ controllers, Leap Motion™, Microsoft Kinect™). Single-handed 6 DOF devices and two-handed devices provide a wider stream of data compared to common 2D input device. This larger stream of information is leveraged in the present invention to parallelize and foster affine transformations operations, as it appear clear in FIG. 19a and FIG. 19b. As result, the present invention enables to save operations steps and time while preserving a reliable and intuitive interaction interface.

The present invention application fields concerns 3D modeling, architecture, design, mechanical engineering, urban design, game design, manufacturing, 3D animation, art, and many others.

SUMMARY OF THE INVENTION

The embodiments of the invention allow the user of a 3D graphics software to execute an affine transformation, like a translation, a rotation or a scale of at least one element of the virtual scene, using a virtual reality input device, in less steps and with a higher precision, reliability and flexibility compared to prior schemes. The embodiments of the invention provide a method to perform an affine transformation in less time than the actual cad system do.

BRIEF DESCRIPTION OF THE DRAWINGS

Referring now to the drawings in which like reference numbers represent corresponding parts throughout:

FIG. 9, illustrates the execution of a rotation operation around a "Z" axis of an element, a chair, according to the first embodiment of the invention;

FIG. 10, illustrates the execution of a rotation operation around a "X" axis of an element, a chair, according to the first embodiment of the invention;

FIG. 14, illustrates the execution of a generic 3D translation operation of an element, a chair, according to the second embodiment of the invention;

FIG. 16, illustrates the execution of a scale operation in one direction of an element, a chair, according to the second embodiment of the invention;

FIG. 17, illustrates the execution of a rotation operation an axis "Z" of an element, a chair, according to the second embodiment of the invention;

FIG. 18, illustrates the execution of a rotation operation an axis "X" of an element, a chair, according to the second embodiment of the invention;

FIG. 19, illustrates a comparison of prior art method and the invention method to execute a 2D rotation;

DETAILED DESCRIPTION OF THE PREFERRED EMBODIMENTS

Figure 1:
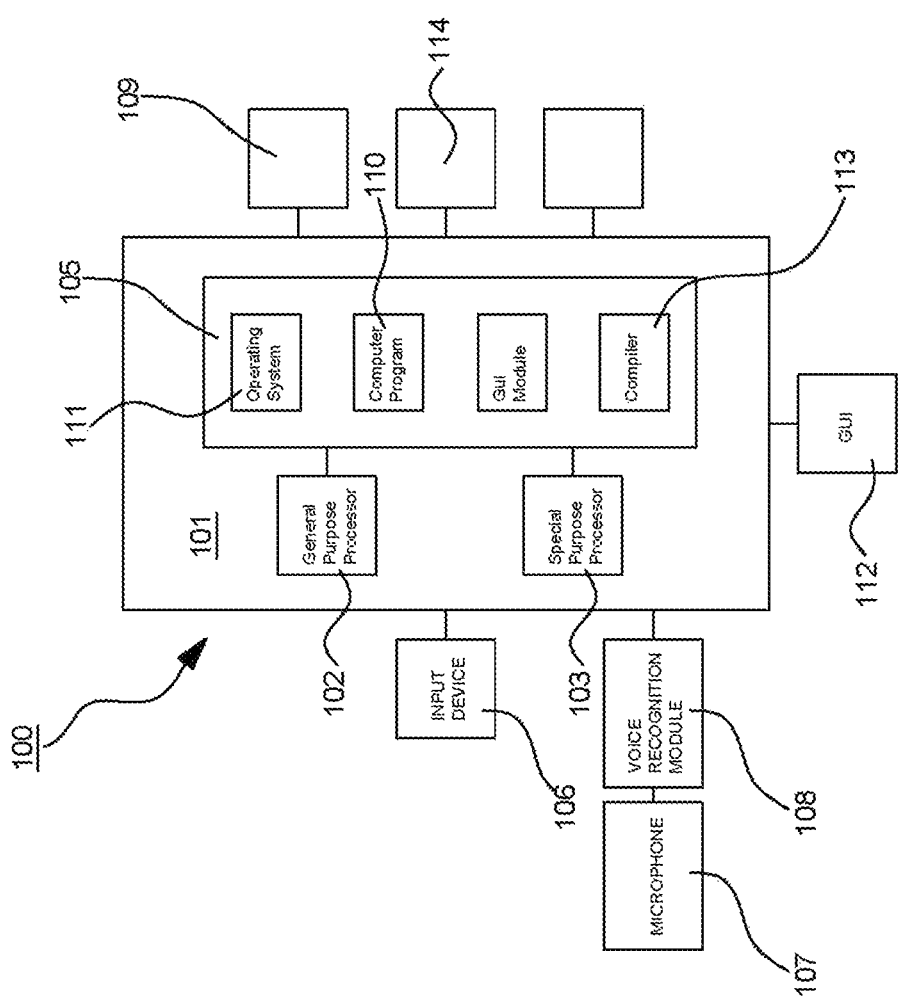
FIG. 1, illustrates an example of the hardware and software apparatus used to implement one or more embodiments of the invention.

Objects, features, and advantages of some aspects will become more apparent when taken in conjunction with the following description and drawings wherein identical reference numerals have been used, where possible, to designate identical features that are common to the figures. The attached drawings are for purposes of illustration and are not necessarily to scale. Throughout this description, some aspects are described in terms that would ordinarily be implemented as software programs. Those skilled in the art will readily recognize that the equivalent of such software can also be constructed in hardware, firmware, or microcode. Because data manipulation algorithms and systems are well known, the present description is directed in particular to algorithms and systems forming part of, or cooperating more directly with, systems and methods described herein. Other aspects of such algorithms and systems, and hardware or software for producing and otherwise processing signals or data involved therewith, not specifically shown or described herein, are selected from such systems, algorithms, components, and elements known in the art. Given the systems and methods as described herein, software not specifically shown, suggested, or described herein that is useful for implementation of any aspect is conventional and within the ordinary skill in such arts.

Some aspects relate to tangible assisted interfaces for computer-human interactions, i.e., in three-dimensional virtual environments (also referred to herein as "three-dimensional scene"). A "virtual environment" or "three-dimensional scene" as used herein can include data representing one or more virtual elements in a virtual space. Such data can be stored in one or more computer-readable media or transferred between computers. Example data formats for virtual environments include the virtual reality modeling language (VRML), the X3D format, the COLLADA format, and 3-D computer-aided design (CAD) formats such as DWG, 3DM, or 3DS. Virtual environment data can also be represented using, i.e., nurbs, splines, T-splines, voxels, point clouds or meshes represented in other formats.

In the following description, reference is made to the attached drawings which form part hereof, and which is shown, by way of illustration, several embodiments of the present invention. It is understood that other embodiments may be utilized and structural changes may be made without departing from the scope of the present invention.

Hardware Apparatus

FIG. 1, illustrate an exemplary system for executing affine transformations of an element in a computer graphic software using a plurality of input devices. The system comprises an hardware processor and a memory. The memory stores the instructions for execution by the hardware processor, which is configured by the instructions to execute affine transformations. The hardware and software apparatus, used to implement one or more embodiments of the invention, is indicated with the reference number 100. The hardware and software environment comprises a computer 101 and might includes peripherals. Computer 101 may be a server computer, user or client computer or a database computer. The computer 101 comprises a general purpose hardware processor 102 and/or a special purpose hardware processor 103, which are alternatively collectively referred to as processor 104. The computer 101 includes a memory 105, such as a random access memory (RAM).

The computer 101 is coupled to, and/or integrated with an input device 106. In a first embodiment of the invention the input device 106 comprises a couple of controllers which are controlled by the users of the apparatus. In this embodiment the input device 106 is a six degree of freedom input device, which provides three-dimensional coordinates of at least two points in the space (one point per each controller), and has at least two switches, each one capable of assuming at least two states (i.e. ON and OFF, or 1 and 0).

Furthermore each controller of the couple provides a data set which comprises the coordinates of the controller in the space and a switch status that is capable of assuming at least two states. The user can change the status of the two switches by interacting with the related button on the related controller. In a preferred embodiment, the controllers are represented in the virtual space and the related points are represented by cursors in the virtual space.

In a different embodiment the input device 106 may be an image based sensor which detects the position and gestures of the hands of the users. In this embodiment the image based sensor provides for each hand of the user a data set. Each data set comprises the coordinates of the hand in the space and a switch status that is capable of assuming at least two states. The user may change the status of the virtual switches by performing the gesture "OK" with the related hand. In another embodiment a realistic or simplified virtual reproduction of the hands are represented in the virtual space, where the input device 106 returns the coordinate of a particular point on user's hands, for instance the tip of the index finger.

In another embodiment of the invention the system comprises a microphone 107 and a voice recognition module 108 configured to detect vocal inputs. The user can change the status of the virtual switches by vocal command. (i.e. Dragon Naturally Speaking™)

In another embodiment of the invention the system comprises an eye tracking module configured to detect eye blinks. The user can change the status of the virtual switches by blinking. (i.e. FOVE™)

In another embodiment of the invention the system comprises a brain-computer interface configured to detect brain electromagnetic signal. The user can change the status of the virtual switches by mind command. (i.e. Emotiv Epoc™)

In one or more embodiments the input device 106 may be the HTC Vive controllers™, Oculus Touch™, Leap motion™, Microsoft Kinect™, Microsoft Kinect 2™, Microsoft Hololens™, ZSpace 3D pen™, Optitrack tracking system™, Remoria VR Lignum™.

In one embodiment, the computer 101 operates by the general purpose processor 102 performing instructions defined by the computer program 110 under control of an operating system 111. The computer program 110 and/or the operating system 111 may be stored in the memory 105 and may interface with the user and/or other devices to accept input and commands from the input device 106 and, based on such input and commands and the instructions defined by the computer program 110 and operating system 111, to provide output and results. The output/results may be presented on the display 109 or provided to another device for presentation or further processing or action. In one embodiment, the display 109 comprises a liquid crystal display (LCD), or alternatively, the display 107 may comprise a light emitting diode (LED) display. In another embodiment the display 107 is virtual reality head mounted display. In any of the foregoing embodiments the display 107 illustrates the virtual environment of the computer graphic software. The image may be provided through a graphical user interface (GUI) module 112. Although the GUI module 112 is depicted as a separate module, the instructions performing the GUI functions can be resident or distributed in the operating system 111, the computer program 110, or implemented with special purpose memory and processors.

Some or all of the operations performed by the computer 101 according to the computer program instructions may be implemented in a special purpose processor 103. In this embodiment, the some or all of the computer program 110 instructions may be implemented via firmware instructions stored in a read only memory (ROM), a programmable read only memory (PROM) or flash memory within the special purpose processor 103 or in memory 105.

The special purpose processor 103 may also be hardwired through circuit design to perform some or all of the operations to implement the present invention. Further, the special purpose processor 103 may be a hybrid processor, which includes dedicated circuitry for performing a subset of functions, and other circuits for performing more general functions such as responding to computer program 110 instructions. In one embodiment, the special purpose processor 103 is an application specific integrated circuit (ASIC).

The computer 101 may also implement a compiler 113 that allows an application or computer program 109 written in a programming language such as COBOL, Pascal, C++, FORTRAN, or other language to be translated into processor 104 readable code. Alternatively, the compiler 113 may be an interpreter that executes instructions/source code directly, translates source code into an intermediate representation that is executed, or that executes stored precompiled code. Such source code may be written in a variety of programming languages such as Java™, Peri™, Basic™, etc.

After completion, the application or computer program 110 accesses and manipulates data accepted from I/O devices and stored in the memory 105 of the computer 101 using the relationships and logic that were generated using the compiler 113.

The computer 101 also optionally comprises an external communication device such as a modem, satellite link, Ethernet card, or other device for accepting input from, and providing output to other computers 101.

In one embodiment, instructions implementing the operating system 111, the computer program 110, and the compiler 113 are tangibly embodied in a non-transient computer-readable medium, e.g., data storage device 114, which could include one or more fixed or removable data storage devices, such as a zip drive, floppy disc drive, hard drive, CD-ROM drive, tape drive, etc.

Further, the operating system 111 and the computer program 110 are comprised of computer program instructions which, when accessed, read and executed by the computer 101, cause the computer 101 to perform the steps necessary to implement and/or use the present invention or to load the program of instructions into a memory 105, thus creating a special purpose data structure causing the computer 101 to operate as a specially programmed computer executing the method steps described herein. Computer program 110 and/or operating instructions may also be tangibly embodied in memory 105 and/or data communications devices, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 101.

Figure 2:
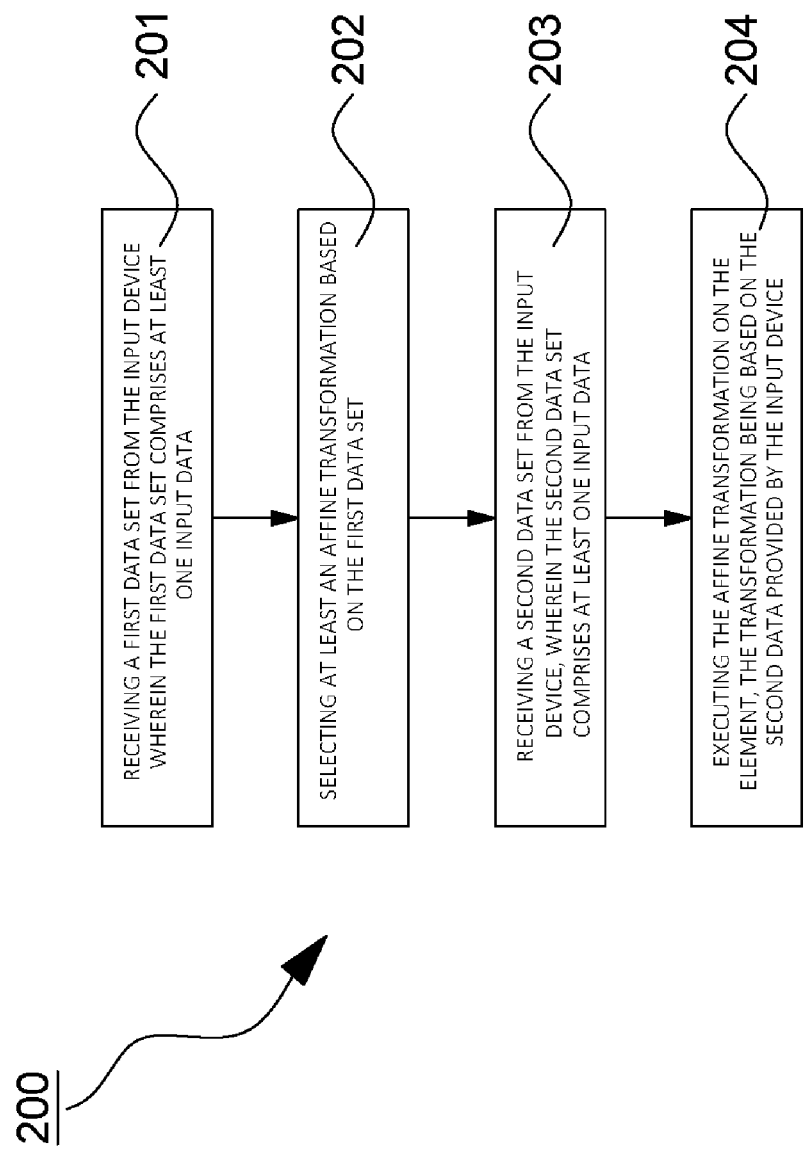
FIG. 2 illustrates a flow chart illustrating method for executing affine transformations on a element in a computer graphic software using an input device, in accordance with one or more embodiments of the invention.

FIG. 2 is a flow chart illustrating the logical flow for executing affine transformations on an element in a computer graphic software using an input device. The method is on the whole indicated with the reference number 200. The first step 201 of the method is the receiving of a first data set from the input device 106. The first data set comprises at least one input data. The second step 202 of the method is the selection of at least an affine transformation based on the first data set. This step is followed by a third step 203 which is receiving a second data set from the input device 106. The second data set comprises at least one input data. The fourth step 204 is the executing the affine transformation on the element. The affine transformation is based on the second data provided by the input device. In a first embodiment the input data of the first and the second data sets, provided by the input device 106, comprise the coordinates of at least one point in the physical space and a switch status. Before the execution of the first step 201 of the method an element in the computer graphic software is selected. In a first embodiment, the user can select the element in the virtual scene through the input device 106. In another embodiment, the system can automatically determine the element by evaluating the closest element to one pointer of the input device 106. In another embodiment, the system can automatically determine the element by evaluating the closest element to the middle point between a couple of input device 106.

The first step 201 of the method concerns the receiving of a first data set from the input device 106. The first data set comprises at least one input data. In a first embodiment the input data of the first set, provided by the input device 106, comprise the coordinates of at least one point in the physical space and a switch status. The input data consists in tridimensional space coordinates of one point the physical space and switch statuses from the input device 106. The switch has at least two statuses, like for instance 1 or 0, or ON or OFF. In a possible embodiment, where the input device 106 comprises a couple of controllers, the first input data set is provided by a first controller and the second data set is provided by the second controller. In another embodiment if the input device 106 is an image based sensor which detects the position and gestures of the hands of the users, the first input data set is provided by a first hand of the user and the second data set is provided by a second hand of the user. In both the foregoing embodiments If the user activates the first switch, the system assigns a temporary label to each controller or hand. For instance, the controller or the hand whose switch has been activated by the user first is assigned the label "A" and, accordingly, the other controller is assigned the label "B". In a preferred embodiment, the cursors inherit the respective label: for instance, the cursor belonging to "controller A" becomes the "cursor A". These labels allow to abstract the interaction from the physical positions of user's hands and/or controllers. In fact, the method presented is meant to be used seamlessly by both right-handed and left-handed users. When the user activates the first switch (switch A), the system stores the coordinates of cursor A into a virtual record called "P0" in the temporary memory. This virtual point may serve as a pivot, anchor or reference point for further functions. The system graphic user interface ("GUI") represents an icon indicating the point P0 in its virtual location. The system also detects the new position of the controller A and stores the vector and the module of segment $\overline{P0A}$ in the temporary memory and keeps updating this record as the user moves the cursor until the operation is complete or until the user further interacts with switch A.

Figure 3:
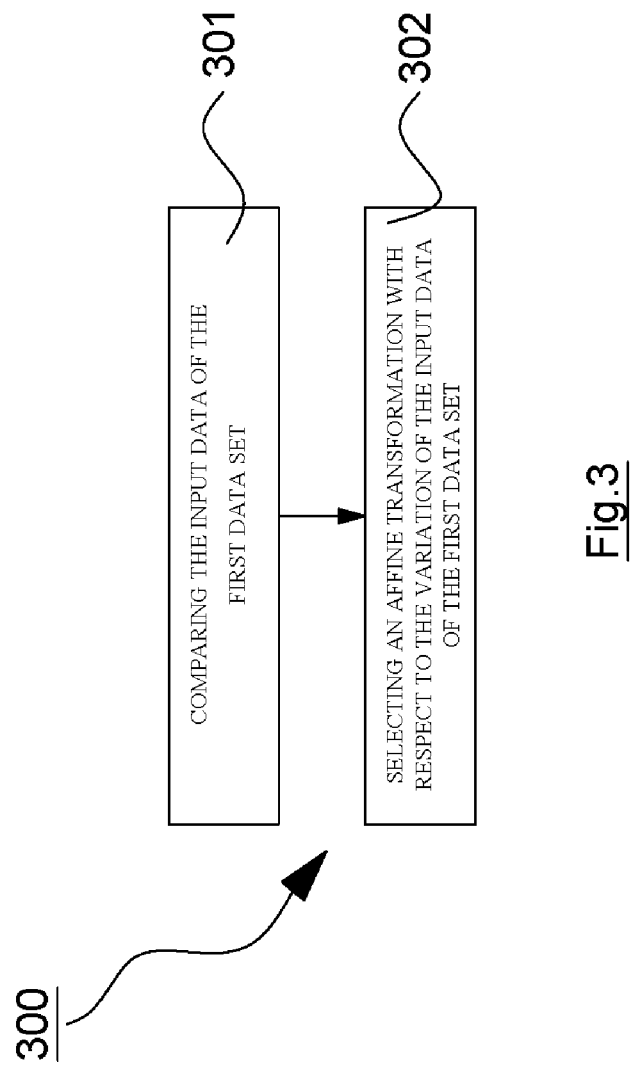
FIG. 3, illustrates a flow chart illustrating the steps of selecting at least an affine transformation.

The second step 202 consists in automatically selecting at least an affine transformation based on the first data set. The FIG. 3, illustrates a flow chart which describes the steps for selecting an affine transformation based on the first data set. The phase of selecting at least an affine transformation comprises the comparing the input data of the first data set 301 and the selecting an affine transformation with respect to the variation of the input data of the first data set 302. The variation of the input data of the first data set comprises the variation of the switch status and the variation of the coordinates of at least one point in the physical space. In a first embodiment the variation of the switch status and a variation of the coordinates of one point in the physical space determines the selection of a translate transformation. In a different embodiment a variation of two switch statuses and a variation of the coordinates of one point in the physical space determines the selection of a rotate transformation. In another embodiment a variation of the coordinates of one point in the physical space defines the a rotation axis. In a different embodiment the variation of two switch statuses determines the selection of a scale transformation. And finally, in another embodiment a variation of two switch statuses and a variation of the coordinates of one point in the physical space determines the selection of a scale transformation.

Before the phase of selecting an affine transformation, the system has stored the vector and the module of segment $\overline{P0A}$ in the temporary memory and keeps updating this record as the user moves the cursor until the operation is complete or until the user further interacts with switch A. Until the distance between P0 and A is lower than threshold $T_1$, the system consider any transformation. In a preferred embodiment threshold $T_1$ may be equal to 2 cm. As soon as the length of $\overline{P0A}$ overcomes the threshold $T_1$, the system discards the scale transformation and leaves rotation and translation as viable options. If the user activates the stop signal, the system performs a rigid translation transformation on the selected element according to the same module and direction of the last vector $\overline{P0A}$ recorded. In a preferred embodiment the user holds switch A for the whole duration of the operation and the stop signal consists in releasing the switch A. In another embodiment the user activates the switch A (for instance, interacts with a button on the controller) and the stop signal consists into a second activation of switch A. The selecting of at least an affine transformation is performed in different ways according to different embodiments of the invention. According to a first embodiment of the invention the user has moved the cursor A over the threshold T1 and then activates the switch B, which causes the system to discards the translation option and selects the rotation transformation. In a possible embodiment, as long as the stop signal is not called and before the switch B is activated, the user can adjust the segment $\overline{P0A}$ as many times as needed by moving the cursor A. When user activates the switch B, the system stores the latest coordinates of cursor A in a virtual record called "P0'" in the temporary memory. The point P0' defines the rotation axis $\overline{P0P0'}$. Contextually, the system evaluates the projection point of cursor B on the virtual plane perpendicular to the rotation axis $\overline{P0P0'}$ passing by point P0 and stores it into a virtual record called "P1". The point P1 will serve as a first reference point for rotating the selected element. If the rotation transformation is selected by the system, the system dynamically measure the rotational angle between the segment $\overline{P0P0}$ and the segment $\overline{P0P1'}$, where P1', the second reference point, is the dynamically updated projection of the cursor B on the virtual plane perpendicular to the axis and passing by point P0. In a different embodiment of the invention, the user activates the switch B before moving the cursor A over the threshold $T_1$ and before the stop signal is activated, the system discards the translation and rotation options and selects scale transformation. When the user activates the switch B, the system stores the latest coordinates of cursor B in a virtual record called "P1" in the temporary memory. If the scale transformation is selected, the system measures X, Y, and Z components of segment $\overline{P0P1}$, according to the global reference system of the scene. Then, the system dynamically evaluates the variations δx, δy and δz of cursor B coordinates. The system evaluates the the sum of the initial measure and the variation (for instance x+δx) for each X, Y, and Z components and scale the selected element accordingly. As a skilled in the art would understand, some combinations of δx, δy, and δz, may lead to respective special cases of SCALE transformation, in particular:

| Cursor B variation conditions | Result |
| --- | --- |
| δx ≠ 0 and δy = δz = 0 | mono-dimensional scale along X direction |
| δy ≠ 0 and δx = δz = 0 | mono-dimensional scale along Y direction |
| δz ≠ 0 and δx = δy = 0 | mono-dimensional scale along Z direction |
| δx = 0 and δy ≠ 0 and δz ≠ 0 | bi-dimensional non-uniform scale on YZ plane |
| δy = 0 and δx ≠ 0 and δz ≠ 0 | bi-dimensional non-uniform scale on XZ plane |
| δz = 0 and δx ≠ 0 and δy ≠ 0 | bi-dimensional non-uniform scale on XY plane |
| δx = 0 and δy = δz ≠ 0 | bi-dimensional uniform scale on YZ plane |
| δy = 0 and δx = δz ≠ 0 | bi-dimensional uniform scale on XZ plane |
| δz = 0 and δx = δy ≠ 0 | bi-dimensional uniform scale on XY plane |
| δx ≠ 0 and δy ≠ 0 and δz ≠ 0 | tri-dimensional non-uniform scale |
| δx = δy = δz ≠ 0 | tri-dimensional uniform scale |
| δx = δy = δz = 0 | the selected element remains unchanged |

In a possible embodiment, the system may approximate variations values below a threshold $T_2$ to zero, so that it is easier for the user to perform mono and bi-dimensional non-uniform scale transformations. In a preferred embodiment threshold $T_2$ may be equal to 2 cm. In a possible embodiment, the system may approximate couple or triplets of variations whose mutual difference is below a threshold $T_3$ to their average, so that it is easier for the user to perform mono, bi, and tri-dimensional uniform scale transformations. In a preferred embodiment threshold $T_3$ may be equal to 2 cm. In another possible embodiment, the user can force the system to perform mono, bi, or tri-dimensional uniform or non-uniform scale transformation by enabling geometric constrains. In a possible embodiment, the system shows the measure to the user through a graphic output. In a possible embodiment, the measure is rounded to the unit or the first or second decimal. After the selection of the affine transformation the system needs a stop signal. In a preferred embodiment the switches have status "on" as long as the user holds the related physical button or maintain a certain gesture with hands. In another embodiment the user may change switches' status to "on" by interacting with the related physical button or performing a certain gesture with the related hand and change switches' status to "off" by repeating the same action. In a preferred embodiment the user keeps both switches status "on" for the whole duration of the operation and the stop signal consists in changing the switches status to off. In another embodiment the stop signal is sent to the system when at least one switch is turned off. In another embodiment the stop signal consist in a vocal command (i.e. "OK"). In another embodiment the stop signal consists in interacting with a virtual user interface in the 3D scene. In another embodiment the stop signal is generated by the user via brain command.

With reference to the FIG. 2, the third step 203 consists in receiving a second data set from the input device 106. The second data set comprises at least one input data. The at least two input data of the first and the second data sets are determined in at least two different temporal instants.

Finally the last step 205 of the method consists in executing the affine transformation on the element. The affine transformation performed in this phase is based on the second data provided by the input device. After the conclusion of the transformation the system receives the stop signal and it applies the latest temporary transformation to the element, store the resulting element in the element database. In a possible embodiment of the invention the element is a group of elements comprising at least one element of the virtual environment of the computer graphic software. In addition, In another possible embodiment the phase of executing the affine transformation creates at least one instance of the element which corresponds to the original element partially or totally transformed. In another possible embodiment the system may delete the previous element, and delete the temporary data records from temporary memory. The operation is then concluded.

Figure 4:
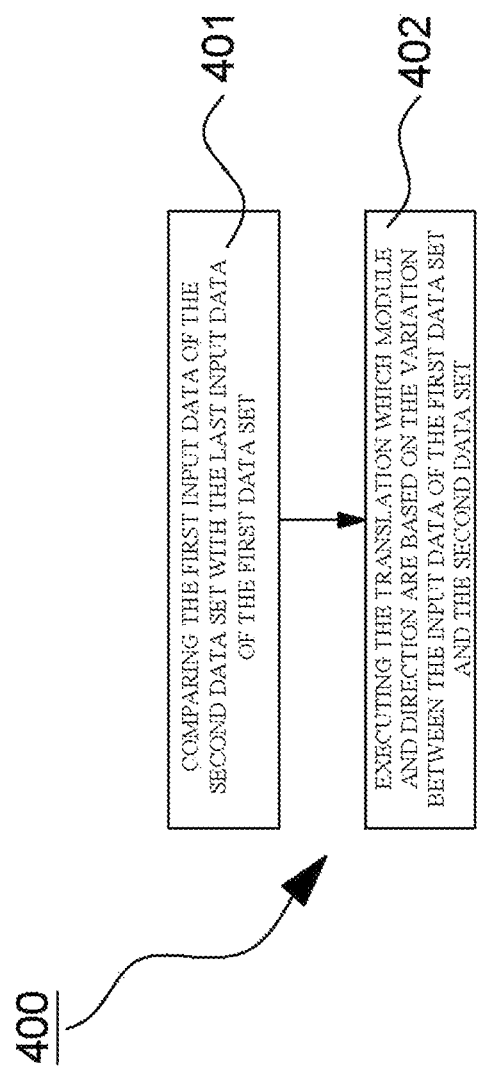
FIG. 4, illustrates a flow chart illustrating the steps of executing the affine transformation on the element according to a first embodiment of the invention.

FIG. 4, illustrates a flow chart 400 which describes the steps for executing the affine transformation on the element. In this phase the transformation is based on the second data provided by the input device and comprises a first step 401, consisting in comparing the first input data of the second data set with the last input data of the first data set. The second step 402 consists in executing the translation which module and direction are based on the variation between the input data of the first data set and the second data set. In a first embodiment of the invention, the variation of the input data of the first data set comprises the variation of the switch status and the variation of the coordinates of at least one point in the physical space. According to one embodiment of the invention the last input data of the second data set provided by the input device comprises a stop signal. In another embodiment of the invention the variation of the input data of the second data set defines a rotation axis.

Figure 5:
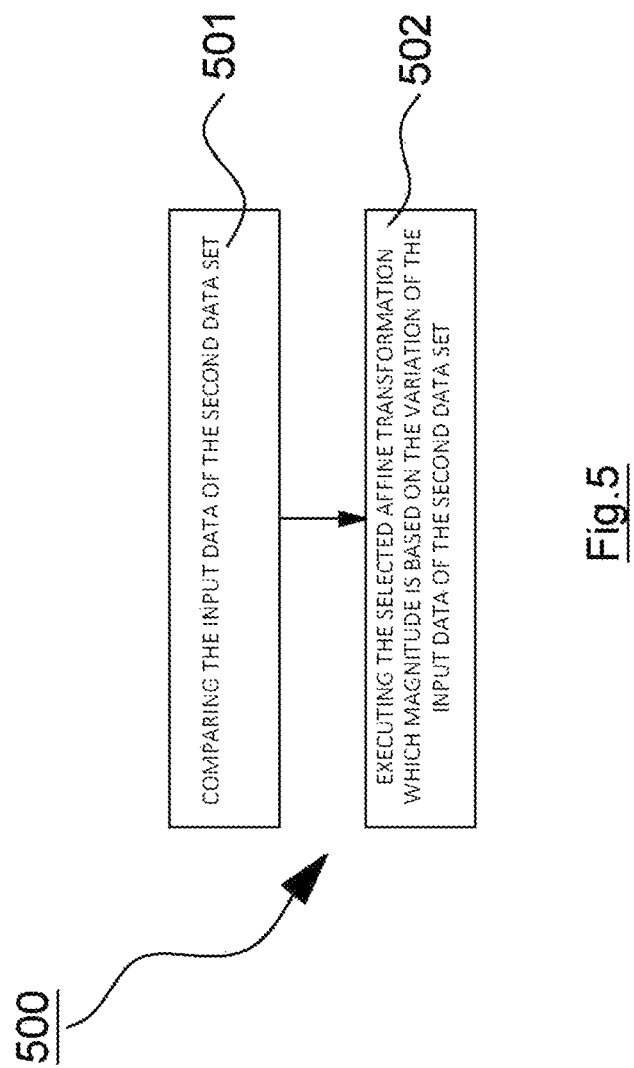
FIG. 5, illustrates a flow chart illustrating the steps of executing the affine transformation on the element according to a second embodiment of the invention.

FIG. 5, illustrates a flow chart 500 which describes the steps for executing the affine transformation on the element according to a different embodiment of the invention. The affine transformation is based on the second data provided by the input device and the phase comprises a first step 501, consisting in comparing the input data of the second data set. The second step 502 consisting in executing the selected affine transformation which magnitude is based on the variation of the input data of the second data set. According to a first embodiment of the invention the variation of the input data of the second data set in the step 502 comprises the variation of the switch status and the variation of the coordinates of at least one point in the physical space. In another embodiment of the invention the variation of the input data of the second data set defines a rotation axis. According to this embodiment, the affine transformation that can be executed may be a rotation or a scale. If the transformation is a rotation the magnitude is the rotation angle. The rotation of an element in the 3D space may be executed around a pivot point defined by the user. if the affine transformation is a scale the element may be scaled in the 3D space with respect an anchor point defined by the user and the magnitude of the transformation is a vector comprising three scale factors depending on three variations δx, δy, and δz. In a different embodiment the magnitude of the affine transformation may also be defined by a couple of reference points.

According to the foregoing embodiments the last input data of the second data set provided by the input device comprises a stop signal. According to the phase of executing the affine transformation on the element in the virtual environment of the computer graphic software, the system may generate a temporary preview of the transformation by applying dynamically the selected element a temporary transformation based on data that is constantly updated until the end of the operation. If rotate transformation is selected, the system generates an element preview consisting in a temporary copy of the selected element and rotates the copy by the measured angle P1 $\widehat{P0}$ P2 around the rotation axis. The system dynamically update said preview as long as the operation is either completed or aborted via stop signal. If scale transformation is selected, the system generates an element preview consisting in a temporary copy of the target scaled by three measured scale factors $$\frac{x+\delta x}{x}, \frac{y+\delta y}{y}, \text{ and } \frac{z+\delta z}{z}$$

with respect of the anchor point P0. The system dynamically update said preview as long as the operation is either completed or aborted via stop signal. In a preferred embodiment the scale may be mono-dimensional, bi-dimensional, or be tri-dimensional depending on the values of cursor B variation components δx, δy, and δz.

Figure 6:
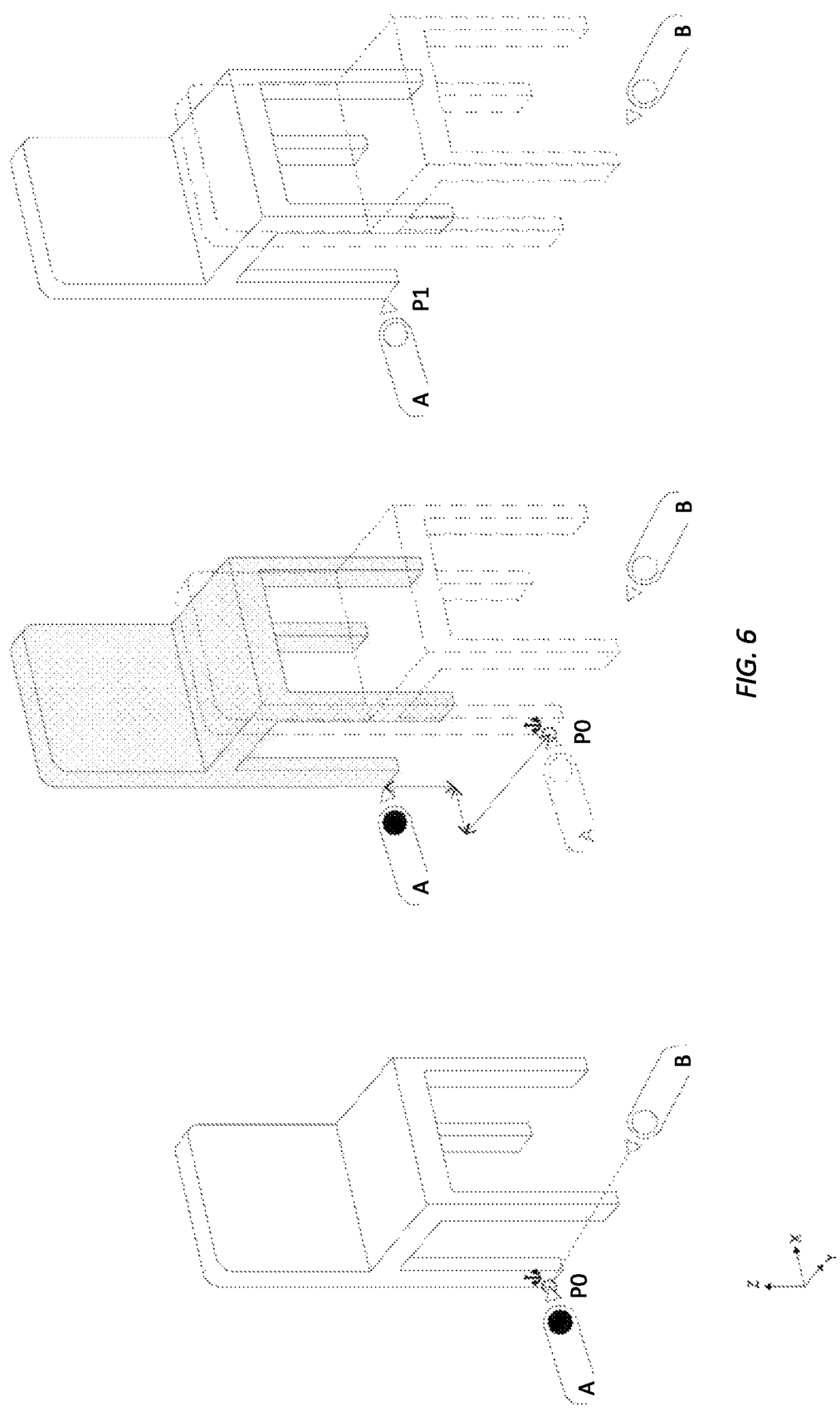
FIG. 6, illustrates the execution of a generic 3D translation operation of an element, a chair, according to a first embodiment of the invention.

FIG. 6 illustrates the execution of a translation operation in two direction of an element, a chair, according to a first embodiment of the invention. The user selects a target element, changes switch A status to "on" to define the start point P0 from cursor A, moves the virtual controller A, changes switch A status to "off" to define the end point P1 from cursor A and complete the operation (stop signal). The system measures the distance and direction between point P0 and P1 and, accordingly, applies the related translation to the target element. In a preferred embodiment the system may correct the coordinates of cursors A and B according to particular conditions. In a possible embodiment, the user activated a "Osnap" function, which as skilled in the art would know, corrects the coordinate of the cursor so that it matches the closest of the notable points. In one embodiment said notable point may correspond, but not limited to: a point cloud in the scene, a vertex of an element in the scene, the middle point of a linear element in the scene, a point is previously defined by the user, the geometric center of a element in the scene, the physic center of an element in the scene, a point on a surface of an element in the scene, a point on a edge of an element in the scene, a point comprised into a volume of an element in the scene, a point aligned with another notable point in the scene.

Figure 7:
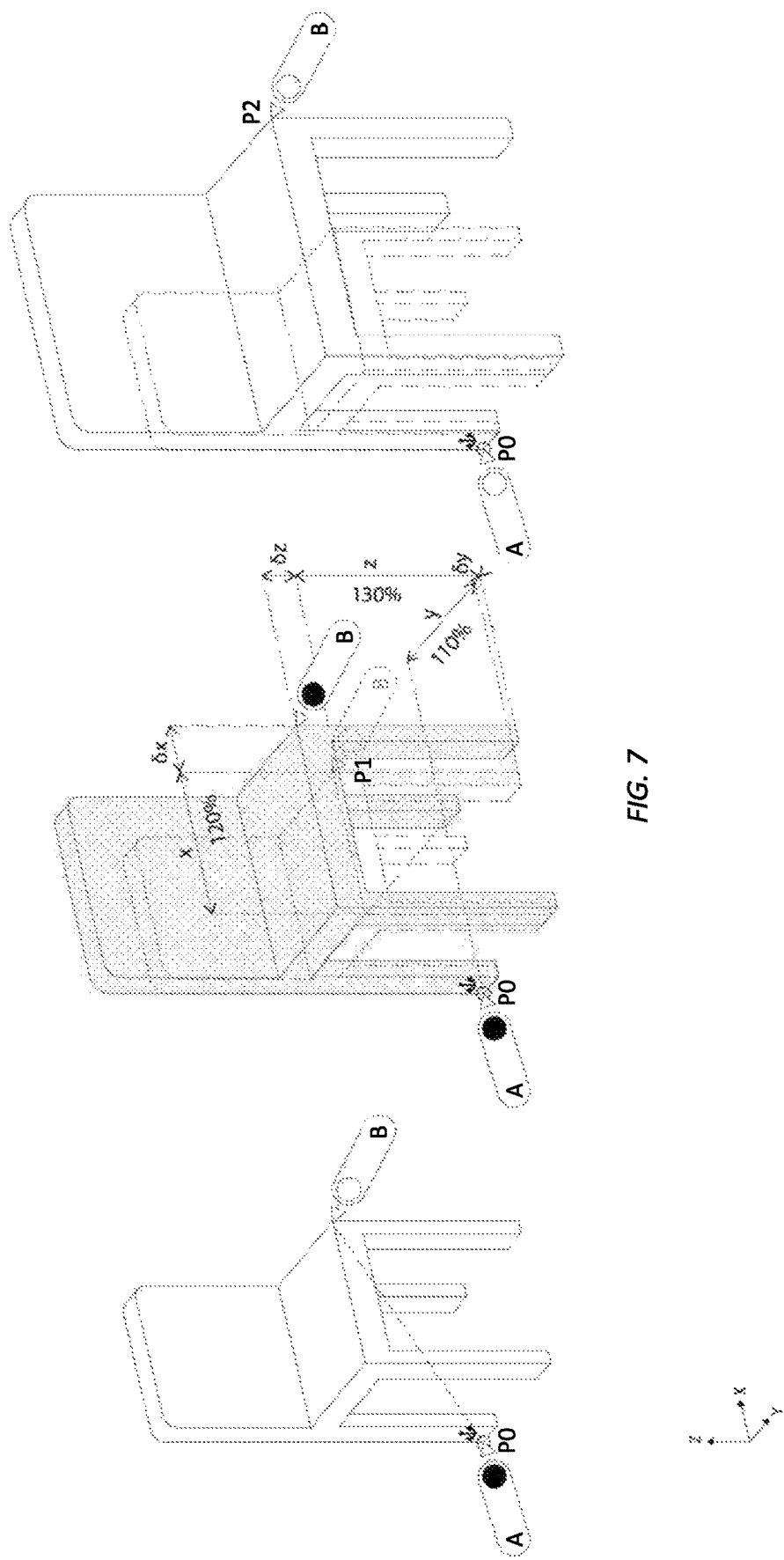
FIG. 7, illustrates the execution of a generic non-uniform 3D scale operation of an element, a chair, according to a first embodiment of the invention.
Figure 8:
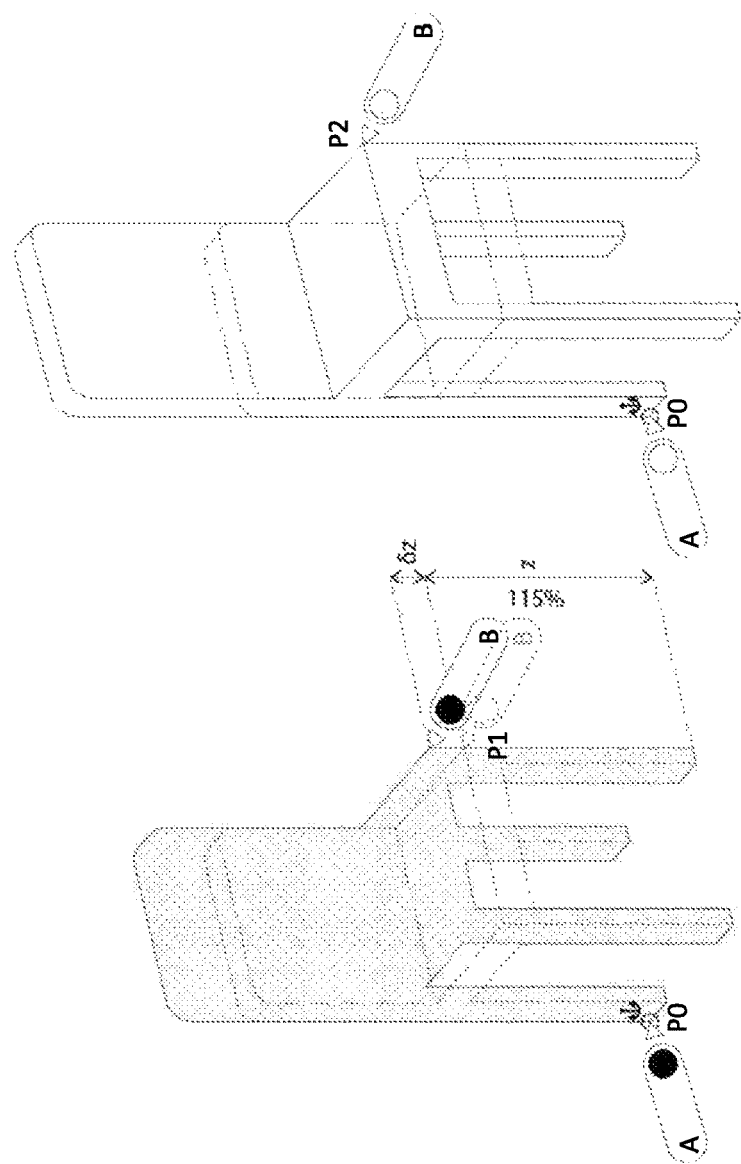
FIG. 8, illustrates the execution of a scale operation in one direction of an element, a chair, according to a first embodiment of the invention.
Figure 11:
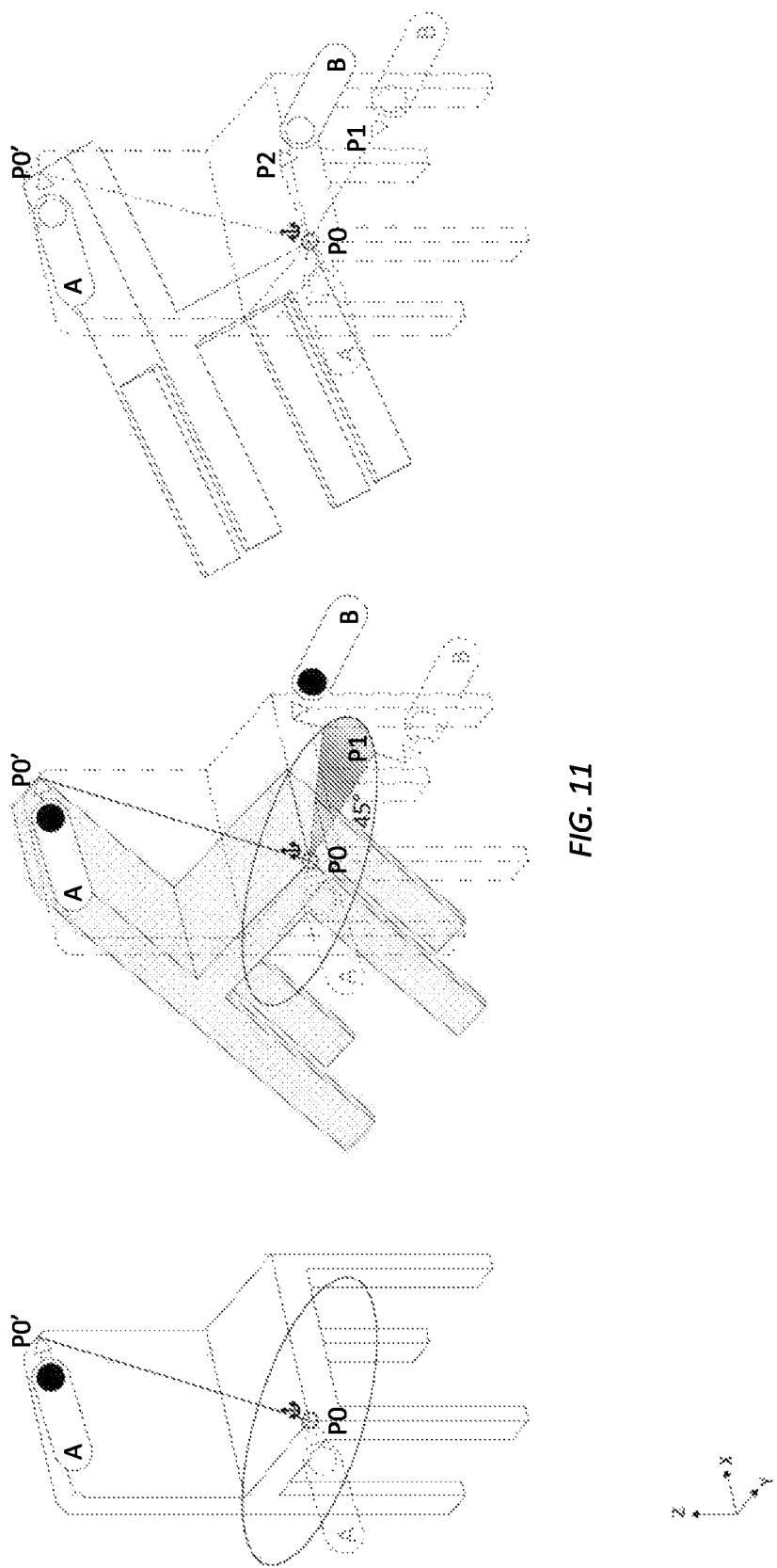
FIG. 11, illustrates the execution of a rotation operation around a generic axis of an element, a chair, according to the first embodiment of the invention.

FIGS. 7 and 8 illustrate the execution of a scale operation in one and three direction of an element, a chair, according to a first embodiment of the invention. The user selects a target element, changes switch A status to "on" to define the anchor point P0 from cursor A. The user changes switch B status to "on" to define a first reference point P1 from cursor B. The user move the cursor B and changes switch B status to "off" to define a second reference point P2 from cursor B and complete the operation (stop signal). The system evaluates three scale factors $$\frac{x+\delta x}{x}, \frac{y+\delta y}{y}, \text{ and } \frac{z+\delta z}{z}$$

from points P0, P1 and P2 and applies a mono, bi, or tri-dimensional scale according to said three scale factors with respect of the anchor point P0.

In a preferred embodiment, the cursor B may snap to a local coordinate system having origin P1 (the "local system" comprising "local axis" and "local vectors") and oriented like the global system when close to one of the axis, the bisector of a plane, or other notable references, where "close" means closer than a threshold $T_2$. In a possible embodiment, the cursor B is aligned with P1 along a local axis (e.g. local X) and a mono-dimensional scale transformation is applied to the selected element. In a possible embodiment, the cursor B is aligned with P1 along a local plane (e.g. local plane XY) and a bi-dimensional scale transformation is applied to the selected element. In a possible embodiment, the cursor B is aligned with P1 along the local plane bisector and a uniform bi-dimensional scale transformation is applied to the selected element. In a possible embodiment, the cursor B is aligned with P0 and P1 and a uniform tri-dimensional scale transformation is applied to the selected element.

FIGS. 8, 9 and 10 illustrate the execution of a rotation operation around a "Z", "X" axis and around a generic axis respectively. The user selects an element, activates the switch A to define the pivot point P0 from cursor A, move the cursor A, whose new position P0' dynamically defines the rotation axis $\overline{P0P0'}$. The user activates the switch B to define the first reference point P1 from cursor B and fix the position and orientation of the rotation axis $\overline{P0P0'}$, where P0' is the position of cursor A and P1 is the projection of cursor B on the rotation plane passing by P0 and perpendicular to the rotation axis $\overline{P0P0'}$ at the moment of activation of switch B. The user changes the status of switch B to "off" to define the second reference point P2, where P2 is the projection of cursor B on said rotation plane, and complete the operation (stop signal). The system measures the angle P1$\widehat{P0}$P2 and rotates the selected element around the axis $\overline{P0P0'}$ by the measured angle.

Figure 12:
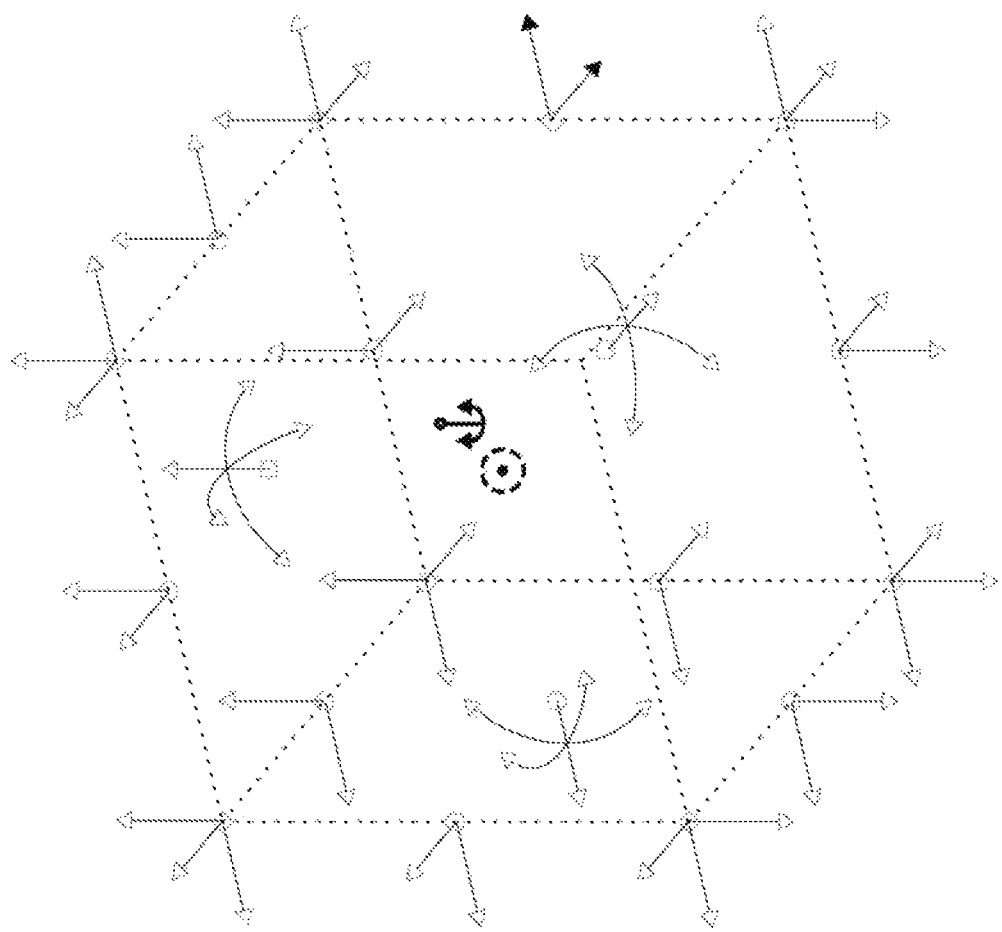
FIG. 12, illustrates the GUI in a second embodiment of the invention.
Figure 13:
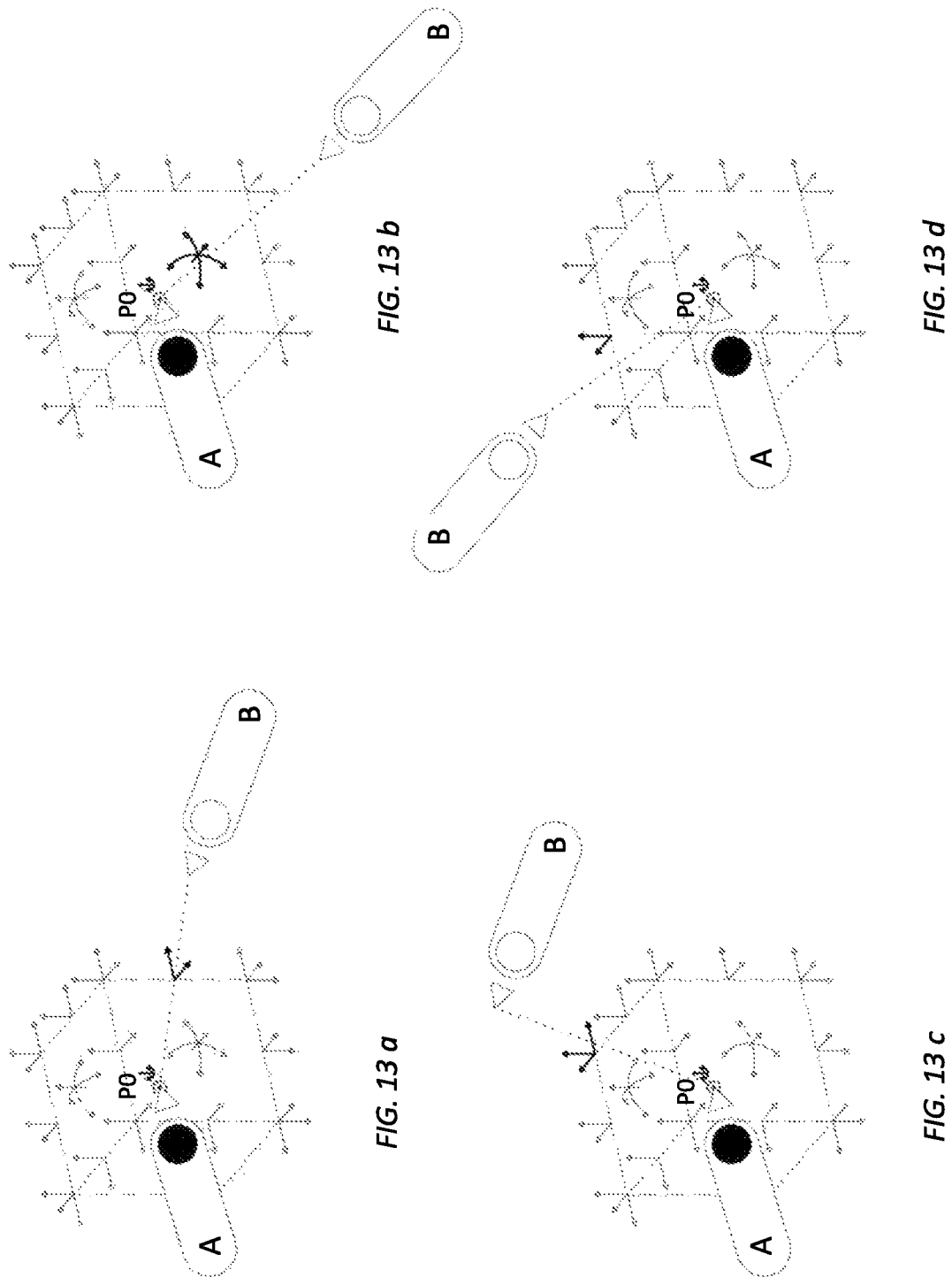
FIG. 13a, illustrates the GUI in a second embodiment of the invention, during the phase of automatically selecting a transformation sub-set comprising uniform 2D scale on XY plane, non-uniform 2D scale, 1D scale in local X direction and 1D scale in local Y direction, with respect of anchor point P0.
FIG. 13b, illustrates the GUI in a second embodiment of the invention, during the phase of automatically selecting a transformation sub-set comprising the rotation around the local "Z" axis, the rotation around the local "X" axis, and 1D scale in local Y direction, with respect of anchor point P0.
FIG. 13c, illustrates the GUI in a second embodiment of the invention, during the phase of automatically selecting a transformation sub-set comprising all kind of uniform and non uniform 1D, 2D, and 3D scale, with respect of anchor point P0.
FIG. 13d, illustrates the GUI in a second embodiment of the invention, during the phase of automatically selecting a transformation sub-set comprising uniform 2D scale on YZ plane, non-uniform 2D scale, 1D scale in local Y direction and 1D scale in local Z direction, with respect of anchor point P0.

FIGS. 12 and 13a, b, c, and d illustrate the GUI (Graphic user interface) in a different embodiment of the invention. According to this embodiment as soon as the distance between P0 and A overcomes the threshold $T_1$, all the other transformations are discarded by leaving translation as valid options. In a preferred embodiment threshold $T_1$ may be equal to 2 cm. If user changes the status of switch A to "off", the system performs a rigid translation (move transformation) of the selected element according to the same module and direction of the last vector $\overline{P0P0'}$ recorded. As long as the distance $\overline{P0P0'}$ is lower than the threshold $T_1$, the system considers any transformation. More in particular, the system evaluates the distance between the cursor B and at least one virtual point properly arranged around P0. Each virtual point is associated with a different action subset. The user can choose the desired subset by moving the cursor B in the virtual space. The system dynamically evaluates the closest virtual point to pointer B and consider the associated sub-set of transformations for further steps. In a preferred embodiment, FIG. 13, 26 virtual points are arranged around P0, where each virtual point is associated with a transformation sub-set. In a preferred embodiment, said 26 points are arranged on the edges, vertexes and face centers of a virtual cube having its geometric center in P0. In a first embodiment, "Top", "Bottom", "Front", "Back", "Right", "Left", and all other combinations of said direction have to be intended relative to the orientation of the 3D scene global coordinate system. More in particular: "Top" direction refers to the positive direction of Z axis, "Front" refers to the positive direction of Y axis, and "Right" refers to the positive direction of X axis of the global reference frame. In a second embodiment, "Top", "Bottom", "Front", "Back", "Right", "Left", and all other combinations of said direction have to be intended relative to the orientation of local coordinate system rigidly coupled with one of the two controllers.

| Virtual point positions relative to P0 | Transformation sub-set |
| --- | --- |
| Back | scale Y, rotate X, rotate Z |
| Front | scale Y, rotate X, rotate Z |
| Bottom | scale Z, rotate X, rotate Y |
| Top | scale Z, rotate X, rotate Y |
| Right | scale X, rotate Y, rotate Z |
| Left | scale X, rotate Y, rotate Z |
| Back Bottom | scale Y, scale Z, |
| BackTop | non-uniform scale YZ, |
| Front Bottom | uniform scale YZ |
| Front Top | |
| Back Right | scale X, scale Y, |
| Back Left | non-uniform scale XY, |
| Front Right | uniform scale XY |
| Front Left | |
| Bottom Right | scale X, scale Z, |
| Bottom Left | non-uniform scale XZ, |
| Top Right | uniform scale XZ |
| Top Left | |
| Back Right Bottom | scale X, scale Y, scale Z, |
| Back Left Bottom | non-uniform scale XY, |
| Back Right Top | uniform scale XY, |
| Back Left Top | non-uniform scale YZ, |
| Front Right Bottom | uniform scale YZ, |
| Front Left Bottom | non-uniform scale XZ, |
| Front Right Top | uniform scale XZ, |
| Front Left Top | non-uniform scale XYZ, uniform scale XYZ |

In a preferred embodiment, the virtual cube is oriented as the global coordinate system. In another embodiment, the virtual cube orientation is oriented as a local coordinate system rigidly coupled with one of the controllers. In another embodiment, an icon is displayed in each virtual point and represent the related action sub-set, as in FIG. 12. Finally in an another embodiment, the icon related to the virtual point which is closer to the cursor B is highlighted, as in FIG. 13.

With regard to the FIGS. 12 and 13, when user activates the switch B, the system stores the coordinates of the cursor B into a virtual record called "P1" in the temporary memory. The point P1 will serve as reference point for rotating or scaling the selected element. Based on which virtual point is the closest to the cursor B when switch B is activated, the system selects the transformation sub-set associated with the selected virtual point and discard the other options. The system continuously receives the tri-dimensional coordinates of the cursor B. Once a sub-set is selected, the system creates a local reference system oriented like the virtual cube and centered in P1. The system evaluates the relative position of B and P1. Based on the relative displacement of cursor B with respect of point P1, the system automatically selects the definitive action from the current action sub-set. More in particular, displacement of cursor B may be either parallel to vector $\overline{P0P1}$, or perpendicular to it, or a combination of thereof where a direction is prevalent. In case the current sub-set comprises either at least a rotate and a scale transformations, if the user moves the cursor B in a direction that is parallel with respect to the vector $\overline{P0P1}$, the system selects and performs a scale transformation; otherwise, if the user moves the cursor B in a direction that is orthogonal with respect to the vector $\overline{P0P1}$, the system selects and performs a rotation transformation. In another embodiment of the present invention the virtual point selected may be associated with a limited sub-set of transformation (e.g. rotation only or scale only). In a different embodiment, the virtual point selected may be associated with a geometrically constrained transformation (e.g. rotation around a particular axis or scale limited to a direction or a plane).

When the rotation transformation is selected, the system evaluates the position of points P0, P1, B, and determine a rotation plane by approximating the plane passing through the three points to one of the three fundamental planes of the local frame in P1 (plane XY, YZ, or ZX). The system defines a rotation axis $\overline{P0P0'}$ as the axis perpendicular to the rotation plane passing by P0. The system evaluates P1', which is defined as the projection of the cursor B on said rotation plane. The point P1' will serve as a first reference point for the rotation. The system measures the angle P1'$\overline{P0}$ B', where B' is the projection of cursor B on said rotation plane. Differently, when scale transformation is selected, point P1 is defined by cursor B when the user changes switch B status to "on".

The system generates a temporary preview of the transformation by dynamically applying to the selected element a temporary transformation based on data that is constantly updated until the end of the operation. If the rotation transformation is selected, the system creates an element preview consisting in a temporary copy of the selected element and rotates the copy by the measured angle P1'$\overline{P0}$B' around the rotation axis $\overline{P0P0'}$. The system dynamically update the preview as long as the operation is either completed or aborted. Differently, if the scale transformation is selected, the system generates an element preview consisting in a temporary copy of the target scaled by three measured scale factors $$\frac{x+\delta x}{x}, \frac{y+\delta y}{y}, \text{ and } \frac{z+\delta z}{z}$$

with respect of the anchor point P0. In a preferred embodiment, measures x, y, z, δx, δy and δz are relative to the local coordinate system of the virtual cube. The system dynamically update said preview as long as the operation is either completed or aborted via stop signal. In a preferred embodiment the scale may be mono-dimensional, bi-dimensional, or be tri-dimensional depending on the transformation subset selected.

FIG. 14 illustrates the execution of a generic 3D translation operation of an element, a chair, according to a different embodiment of the invention. the translation transformation is executed in the same way of the first embodiment illustrated in FIG. 6.

Figure 15:
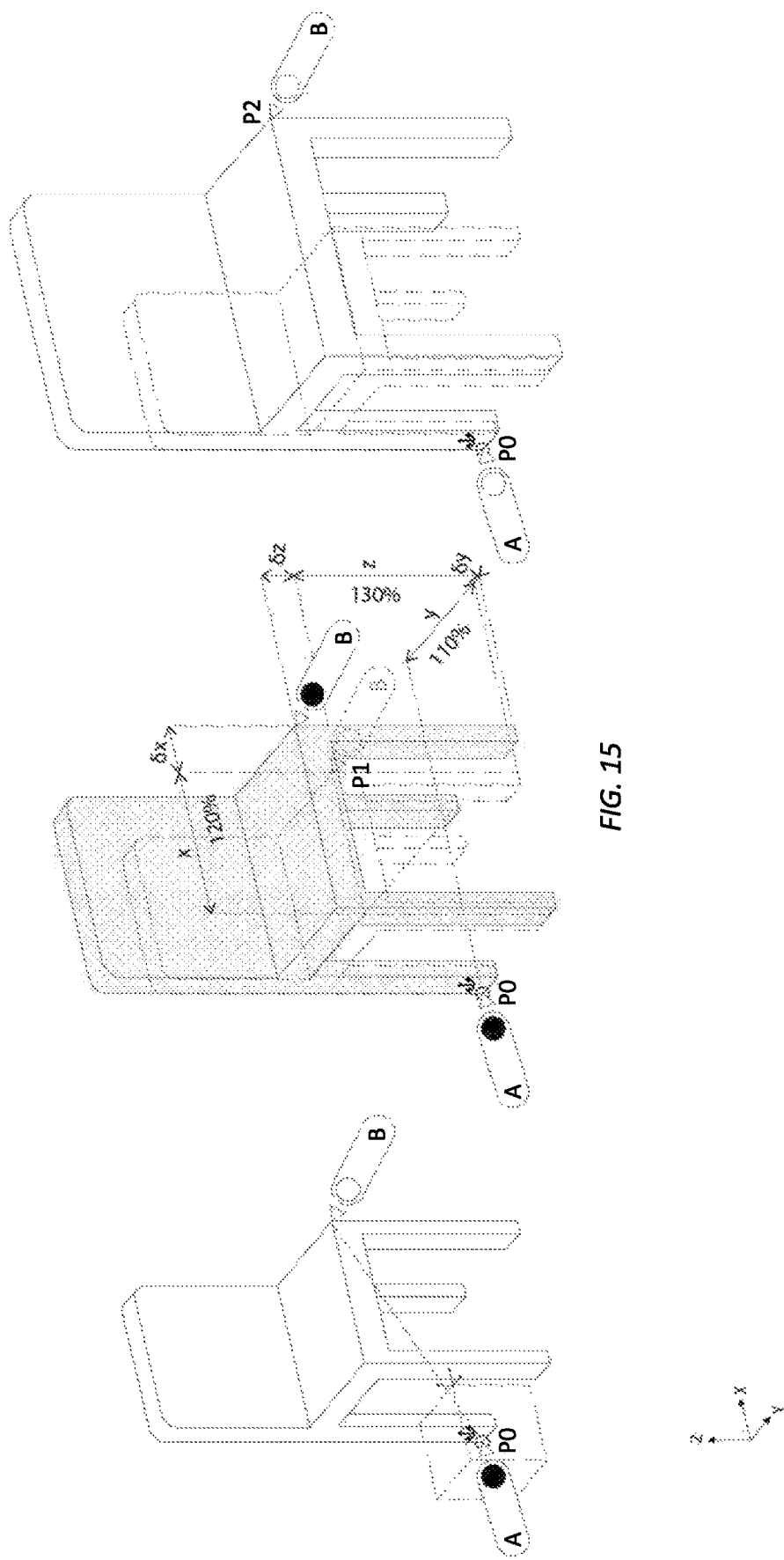
FIG. 15, illustrates the execution of a generic non-uniform 3D scale of an element, a chair, according to the second embodiment of the invention.

FIGS. 15 and 16, illustrates the execution of a scale operation in three and one direction of an element, a chair, according to the second embodiment of the invention. according to this embodiment the user selects a selected element, changes switch A status to "on" to define the anchor point P0 from cursor A. The user places the cursor B near one of virtual points on the edges or vertex of the virtual cube and changes switch B status to "on" to define a first reference point P1 from cursor B. The user move the cursor B and changes switch B to "off" to define a second reference point P2 from cursor B and complete the operation (stop signal). The system evaluates three scale factors $$\frac{x+\delta x}{x}, \frac{y+\delta y}{y}, \text{ and } \frac{z+\delta z}{z}$$

from points P0, P1 and P2 and applies a mono, bi, or tri-dimensional scale according to these three scale factors with respect of the anchor point P0. In a preferred embodiment, the cursor B may snap to a local coordinate system having origin P1 (the "local system" comprising "local axis" and "local vectors") and oriented like the global system when close to one of the axis, the bisector of a plane, or other notable references, where "close" means closer than a threshold $T_2$. In a possible embodiment, the cursor B is aligned with P1 along a local axis (e.g. local X) and a mono-dimensional scale transformation is applied to the selected element. In another possible embodiment, the cursor B is aligned with P1 along a local plane (e.g. local plane XY) and a bi-dimensional scale transformation is applied to the selected element. In another embodiment, the cursor B is aligned with P1 along the local plane bisector and a uniform bi-dimensional scale transformation is applied to the selected element. In final embodiment, the cursor B is aligned with P0 and P1 and a uniform tri-dimensional scale transformation is applied to the selected element.

Figure 20:
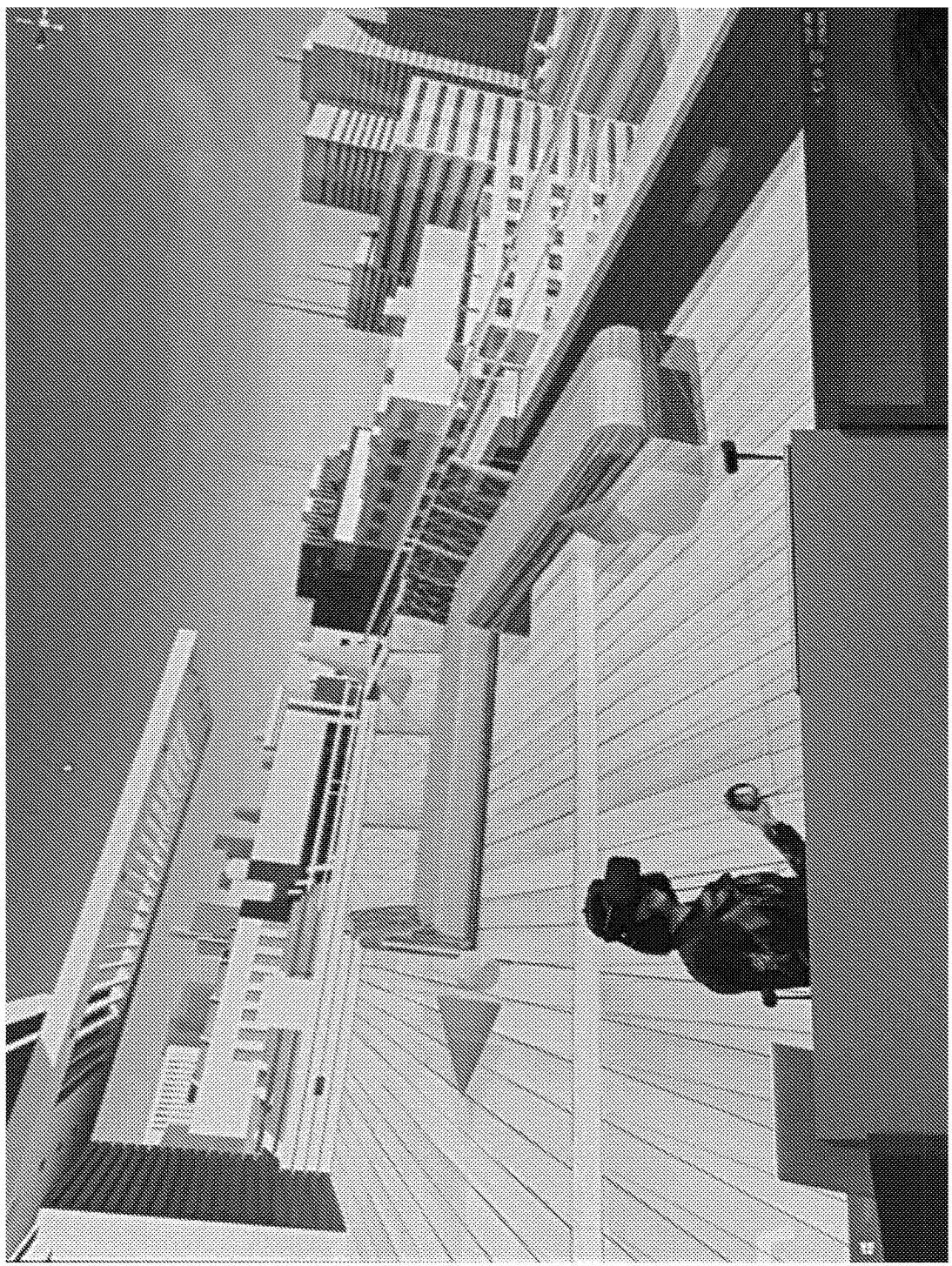
FIG. 20, illustrates a live presentation of a prior art immersive 3D interface.

FIGS. 17 and 18, illustrate the execution of a rotation operation around an axis "Z" and "X" respectively of an element, a chair, according to a second embodiment of the invention. According to this embodiment the user selects a selected element, changes switch A status to "on" to define the pivot point P0 from cursor A. The user places the cursor B closer to one of virtual points on one of the center of the faces of the virtual cube and changes switch B status to "on" to define the first reference point P1 from cursor B. The user moves the cursor B, the system selects the rotation axis and related rotation plane based on the direction where cursor B moved (i.e. if the sub-set comprised axis Z and X, if the cursor moves in a prevalent direction on the XY plane, axis Z is selected), and evaluates points P1', P0, B', where P1' is the projection of point P1 on said rotation plane and B' is the projection of cursor B on said rotation plane. The user changes switch B status to "off" to define the second reference point B', where B' is the projection of cursor B on said rotation plane at the moment when switch B status is changed, and complete the operation (stop signal). The system measures the angle P1'$\overline{P0}$B'. Accordingly, the system rotates the selected element around the axis $\overline{P0P0'}$ by the measured angle;

FIG. 19, illustrates a comparison of prior art method and the invention method to execute a 2D rotation. More in particular, FIG. 19a illustrates a temporal chart that lists the necessary steps to perform a 2D rotation using a mouse with a prior method in two commercial software (McNeel Rhinoceros 5™ and Autodesk Autocad 2017™) and shows that at least nine steps are necessary, included a step for selecting the transformation. FIG. 19b illustrates a temporal chart that lists the necessary steps to perform a 2D rotation using a 3D input device with the invention's method. The comparison shows that using a 3D input device and the invention's method the same result can be achieved in less time and with less steps. More in particular, transformation selection step is not present in the invention timeline as it is automatically performed by the computer and at least one step can be parallelized by executing the transformation with a two-handed device;

FIG. 20, illustrates a live presentation of a prior art immersive 3D interface. More in particular, the figure shows a GUI gizmo in a virtual reality environment configured to transform a 3D element. The figure further shows that in prior art virtual interfaces the gizmo appears around a bounding box and no other anchor or pivot point are selectable other than the center of said bounding box.

The invention claimed is:

1. A method for executing affine transformations on an element in a computer graphics software using a 6 DOF input device, comprising:

receiving a first data set from the 6 DOF input device, wherein the first data set comprises at least one input data, the input data comprising coordinates of at least one 3D point in a physical space, a switch status and a variation of the input data of the first data set;

selecting at least an affine transformation based on the first data set, wherein selecting an affine transformation comprises comparing the input data of the first data set with its variation and selecting an affine transformation, wherein one or more variations of the first data set is unequivocally associated with a set of affine transformations;

receiving a second data set from the 6 DOF input device, wherein the second data set comprises at least one input data, the input data comprising the coordinates of at least one 3D point in the physical space and a switch status, and a variation of the input data of the second data set, determining a subset of the affine transformation, a magnitude, and at least one of the following: a direction in 3D space, a 3D anchor point, a 3D reference start point, a 3D reference end point, wherein a plurality of virtual points are arranged around the at least one 3D point of the first data set, wherein each virtual point is associated with a transformation subset, wherein said plurality of virtual points are arranged on the edges, vertices and face centers of a virtual cube having its geometric center in the at least one 3D point of the first data set, and wherein determining the transformation subset comprises evaluating the closest virtual point from at least one 3D point in the physical space of the second data set, and considering the affine transformation associated with the closest virtual point for further steps;

executing the affine transformation on the element, the transformation being based on the first and second data sets provided by the 6 DOF input device, wherein the affine transformation is a subset of the affine transformation including a magnitude and at least one of the following: a direction in 3D space, a 3D anchor point, a 3D reference start point and a 3D reference end point.

2. The method for executing affine transformations on an element in a computer graphics software using a 6 DOF input device, according to claim 1, wherein a variation of the coordinates of the 3D point in the first data set determines the selection of a translate transformation, a direction in space, and a module.

3. The method for executing affine transformations on an element in a computer graphics software using a 6 DOF input device, according to claim 1, wherein the coordinates of the 3D point in the first data set, the coordinates of the 3D point in the second data set, and a variation of coordinates of the 3D point in the second data set and of the two switch statuses determines a selection of a rotate transformation and a rotation axis in the space, a magnitude, an initial reference 3D point and a final reference 3D point of the rotation transformation.

4. The method for executing affine transformations on an element in a computer graphics software using a 6 DOF input device, according to claim 1, wherein the coordinates of the 3D point in the first data set, the coordinates of the 3D point in the second data set, and a variation of coordinates of the 3D point in the second data set determines a selection of a scale transformation and an anchor point, at least a magnitude, a reference start 3D point and a reference end 3D point of the scale transformation.

5. The method for executing affine transformations on an element in a computer graphics software using a 6 DOF input device, according to claim 4, wherein the scale transformation is a 1D scale transformation.

6. The method for executing affine transformations on an element in a computer graphics software using a 6 DOF input device, according to claim 4, wherein the scale transformation is 2D scale transformation.

7. The method for executing affine transformations on an element in a computer graphics software using a 6 DOF input device, according to claim 4 wherein the scale transformation is a 3D scale transformation.

8. The method for executing affine transformations on an element in a computer graphics software using a 6 DOF input device, according to claim 4, wherein the scale transformation is uniform tridimensional scale transformation.

9. The method for executing affine transformations on an element in a computer graphics software using a 6 DOF input device, according to claim 4, wherein the scale transformation is a non-uniform scale transformation.

10. A system for executing affine transformations on an element in a computer graphics software using a 6 DOF input device, the system comprising:

a hardware processor and a memory storing instructions for execution by the hardware processor, wherein the hardware processor is configured by the instructions to:

receiving a first data set from the 6 DOF input device, wherein the first data set comprises at least one input data, the input data comprising the coordinates of at least one 3D point in a physical space, a switch status, and a variation of the input data of the first data set, selecting at least an affine transformation based on the first data set, wherein selecting an affine transformation comprises comparing the input data of the first data set with its variation and selecting an affine transformation, wherein one or more variations of the first data set is unequivocally associated with a set of affine transformations;

receiving a second data set from the 6 DOF input device, wherein the second data set comprises at least one input data, the input data comprising the coordinates of at least one 3D one point in the physical space and a switch status, and a variation of the input data of the second data set;

determining a subset of the affine transformation, a magnitude, and at least one of the following: a direction in 3D space, a 3D anchor point, a 3D reference start point, a 3D reference end point, wherein a plurality of virtual points are arranged around the at least one 3D point of the first data set, wherein each virtual point is associated with a transformation subset, wherein said plurality of virtual points are arranged on the edges, vertices and face centers of a virtual cube having its geometric center in the at least one 3D point of the first data set, and wherein determining the transformation subset comprises evaluating the closest virtual point from at least one 3D point in the physical space of the second data set, and considering the affine transformation associated with the closest virtual point for further steps;

executing the affine transformation on the element, the transformation being based on the first and second data sets provided by the 6 DOF input device, wherein the affine transformation is a subset of the affine transformation including a magnitude and at least one of the following: a direction in 3D space, a 3D anchor point, a 3D reference start point and a 3D reference end point.

11. A non-transitory computer readable medium having stored thereon instructions that, when executed by one or more processors, cause the one or more processors to execute a method for executing affine transformations on an element in a computer graphics software using a 6 DOF input device according to claim 1.

\* \* \* \* \*